US008581421B2

(12) United States Patent
Shimizu et al.

(10) Patent No.: US 8,581,421 B2
(45) Date of Patent: Nov. 12, 2013

(54) SEMICONDUCTOR PACKAGE MANUFACTURING METHOD AND SEMICONDUCTOR PACKAGE

(75) Inventors: Noriyoshi Shimizu, Nagano (JP); Akio Rokugawa, Nagano (JP); Hirokazu Yoshino, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 102 days.

(21) Appl. No.: 13/328,529

(22) Filed: Dec. 16, 2011

(65) Prior Publication Data

US 2012/0153457 A1 Jun. 21, 2012

(30) Foreign Application Priority Data

Dec. 20, 2010 (JP) ................................. 2010-283705

(51) Int. Cl.
*H01L 23/48* (2006.01)
*H01L 23/52* (2006.01)
*H01L 29/40* (2006.01)

(52) U.S. Cl.
USPC ........... 257/784; 257/777; 257/781; 257/787; 257/E21.006; 257/E21.007; 257/E21.249; 257/E21.259; 257/E21.499; 257/E21.502; 257/E21.503; 257/E21.509

(58) Field of Classification Search
USPC ......... 257/784, 781, 787, 777, 766, 762, 750, 257/734, E21.006, E21.007, E21.249, 257/E21.259, E21.499, E21.502, E21.503, 257/E21.509
See application file for complete search history.

(56) References Cited

U.S. PATENT DOCUMENTS

| 6,121,553 | A | * | 9/2000 | Shinada et al. | ............... | 174/259 |
| 6,545,364 | B2 | * | 4/2003 | Sakamoto et al. | ............ | 257/773 |
| 6,548,328 | B1 | * | 4/2003 | Sakamoto et al. | ............ | 438/121 |
| 6,864,121 | B2 | * | 3/2005 | Sakamoto et al. | ............ | 438/110 |

FOREIGN PATENT DOCUMENTS

JP 4271590 3/2009

* cited by examiner

*Primary Examiner* — David Nhu
(74) *Attorney, Agent, or Firm* — Rankin, Hill & Clark LLP

(57) ABSTRACT

According to one embodiment, there is provided a semiconductor package manufacturing method utilizing a support body in which a first layer is stacked on a second layer, the method including: a first step of forming an opening in the first layer to expose the second layer therethrough; a second step of arranging a semiconductor chip on the second layer through the opening; a third step of forming a resin portion on the first layer to cover the semiconductor chip; and a fourth step of forming a wiring structure on the resin portion so as to be electrically connected to the semiconductor chip.

17 Claims, 24 Drawing Sheets

SEMICONDUCTOR PACKAGE MANUFACTURING METHOD AND SEMICONDUCTOR PACKAGE

CROSS-REFERENCE TO RELATED APPLICATION(S)

This application claims priority/priorities from Japanese Patent Application No. 2010-283705 filed on Dec. 20, 2010, the entire contents of which are incorporated herein by reference.

FIELD

The present invention relates to a manufacturing method for a semiconductor package having a semiconductor chip and a resin portion that covers the semiconductor chip, and to the semiconductor chip.

BACKGROUND

Generally, a semiconductor package has a structure in which a semiconductor chip is covered with a resin portion.

For example, side surfaces and an active surface (circuit forming surface) of a semiconductor chip may be covered with a resin portion. And, a wiring structure in which a wiring layer electrically connected to the semiconductor chip and an insulating layer are stacked may be further formed on the resin portion.

For example, JP-4271590-B discloses a manufacturing method for such a semiconductor chip.

For example, a supporting body is prepared. A semiconductor chip is mounted on the prepared supporting body such that a surface of the semiconductor chip, which is opposite to an active surface thereof, touches a surface of the supporting body. Then, the mounted semiconductor chip is sealed with a resin portion. Thereafter, a wiring layer and an insulating layer are stacked on the resin portion to form a wiring structure. Then, the supporting body is removed. Thus, a semiconductor package is manufactured.

In order to reduce the thickness of a semiconductor package, it may be requested to reduce the thickness of a resin portion. For example, a supporting body is prepared, a concave portion is formed in the supporting body by removing a part thereof to a certain depth, a semiconductor chip is arranged on the formed concave portion, a resin portion and a wiring structure is formed, and then, the supporting body is removed, to thereby manufacture a semiconductor package while reducing the thickness of the resin portion in a region around the semiconductor chip.

On the other hand, it is difficult to partly remove the support body at a uniform depth from the surface thereof by, e.g., etching. Thus, an in-plane variation of the depth of the formed concave portion may occur, and the surface flatness of the resin portion covering the semiconductor chip may be poor.

SUMMARY

According to one embodiment, there is provided a semiconductor package manufacturing method utilizing a support body in which a first layer is stacked on a second layer, the method including: a first step of forming an opening in the first layer to expose the second layer therethrough; a second step of arranging a semiconductor chip on the second layer through the opening; a third step of forming a resin portion on the first layer to cover the semiconductor chip; and a fourth step of forming a wiring structure on the resin portion so as to be electrically connected to the semiconductor chip.

According to the above-mentioned aspects of the present invention, there is provided a manufacturing method for a semiconductor package which is reducible in thickness and superior in the surface flatness of a resin portion covering a semiconductor chip, and may also provide such a semiconductor package.

DETAILED DESCRIPTION

Hereinafter, embodiments are described with reference to the drawings.
(First Embodiment)
[Structure According to First Embodiment]

Figure 1:
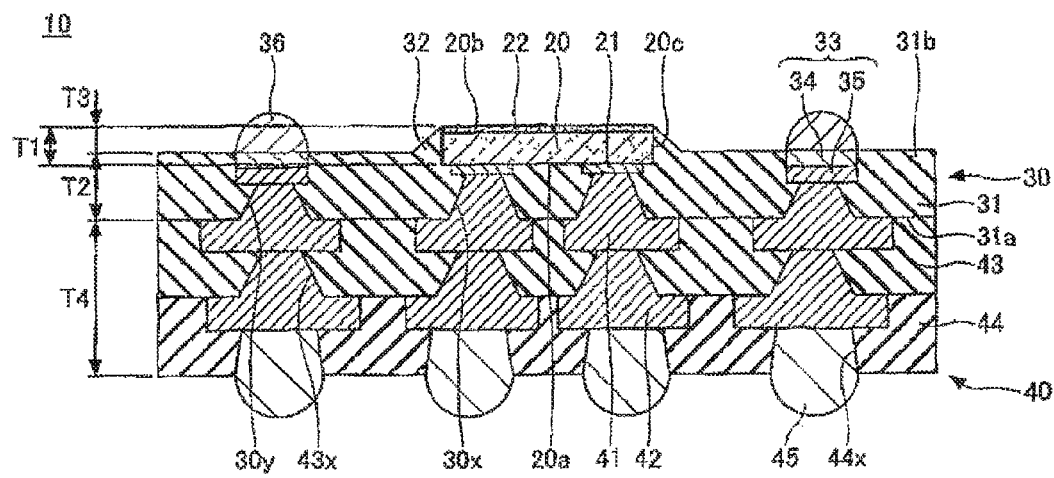
FIG. 1 cross-sectionally illustrates a semiconductor package according to a first embodiment.

FIG. 1 cross-sectionally illustrates a semiconductor package according to a first embodiment. Referring to FIG. 1, a semiconductor package 10 includes a semiconductor chip 20, a resin portion 30 and a wiring structure 40.

The semiconductor chip 20 includes a semiconductor substrate. In the semiconductor chip 20, a semiconductor integrated circuit (not shown) and an electrode pad 21 are formed on, e.g., a surface (circuit forming surface) 20a facing the wiring structure 40.

For example, a silicon (Si) substrate may be used as the semiconductor substrate.

The size of the semiconductor chip 20 as viewed from above may be set at, e.g., about 8 millimeters (mm)×8 mm, and the thickness thereof may be set at, e.g., about 75 micrometers (μm) (an applicable range is from 50 μm to 125 μm).

An adhesive layer 22 may be formed on a surface (back surface) 20b of the semiconductor chip 20 opposite to the circuit forming surface 20a. In FIG. 1, the adhesive layer 22 is formed on the back surface 20b. The thickness of the adhesive layer 22 may be set at, e.g., about 20 μm. Accordingly, the thickness T1 of the semiconductor chip 20, which includes the thickness of the adhesive layer 22, may be set at, e.g., about 95 μm (an applicable range is from 70 μm to 145 μm).

A resin portion 30 is integrally formed, and includes a body part 31 and a side wall part 32. The resin portion 30 is made of, e.g., a resin material such as an epoxy resin or a polyimide resin.

The body part 31 covers the circuit forming surface 20a of the semiconductor chip 20, and a surface 31a thereof facing the wiring structure 40 is flat. A surface 31b of the body part 31 opposite to the surface 31a is located closer to the wiring structure than to the back surface 20b of the semiconductor chip 20. In other words, the back surface 20b of the semiconductor chip 20 protrudes from the surface 31b of the body part 31, and the circuit forming surface 20a of the semiconductor chip 20 is embedded into the body part 31. The thickness T2 of the body part 31 may be set at, e.g., 50 μm (an applicable range is from 45 μm to 120 μm).

The side wall part 32 covers a side surface 20c of the semiconductor chip 20. The side wall part 32 has a tapered shape whose width increases from the back surface 20b towards the circuit forming surface 20a of the semiconductor chip 20. This is because an opening formed in a first layer of the supporting body, which will be described later, has a tapered shape in which a width decreases towards a depth direction. Consequently, as to be described later with reference to FIG. 25, when the space between the semiconductor chip 20 and a second semiconductor chip 60 mounted thereon is filled with an underfill resin 62, generated bubbles are difficult to be entrained in the underfill resin 62. The height T3 of the side wall part 32 may be set at, e.g., about 70 μm (an applicable range is from 35 μm to 105 μm).

When the thickness T1 of the semiconductor chip 20 is set at, e.g., 95 μm, while the height T3 of the side wall part 32 is set at 70 μm, a part having a thickness 25 μm (=T1−T3) from the circuit forming surface 20a of the semiconductor chip 20 is embedded in the body part 31.

If the side wall part 32 is not provided and the entire semiconductor chip 20 is embedded in the resin portion 30, a thickness of (T2+T3) (e.g., 50 μm+70 μm=120 μm) is needed as the thickness of the resin portion 30. On the other hand, in the semiconductor package according to the first embodiment, a thickness of T2 (e.g., 50 μm) is sufficient for the thickness of the body part 31 in a region around the semiconductor chip 20. Thus, the thickness of the resin portion 30 may be reduced.

Electrode terminals 33 are formed on the surface 31b of the body part 31. Each electrode terminal 33 is formed by, for example, stacking a first electrode layer 34 and a second electrode layer 35 in a direction from the surface 31b towards the surface 31a. For example, a gold (Au) layer, a Ni/Au layer formed by stacking a Ni-layer and an Au-layer in this order on the second electrode layer 35, a Ni/Pd/Au layer formed by stacking a Ni-layer, a Pd-layer and an Au-layer in this order on the second electrode layer 35 may be used as the first electrode layer 34. And, a Cu-layer or the like may be used as the second electrode layer 35. The diameter of the electrode terminal 33 may be set at, e.g., about 200 μm. A solder bump 36 is mounted on the electrode terminal 33.

The wiring structure 40 is configured by alternately stacking wiring layers and insulating layers. The number of the wiring layers may be set at a given value. The number of the insulating layers may be set at a value at which the wiring layers are insulated from one another by the insulating layers. In FIG. 1, the wiring structure 40 includes a first wiring layer 41, a second wiring layer 42, and a first insulating layer 43.

The wiring structure 40 is formed above the surface 31a of the body part 31 (i.e., below the surface 31a, as viewed in FIG. 1), and the thickness T4 thereof may be set at 80 μm to 400 μm. For example, in the case of stacking two to six wiring-layers, the thickness T4 of the wiring structure 40 may range from 80 μm to 400 μm.

Each first wiring layer 41 is formed on/in the surface 31a of the body part 31 (i.e., under/in the surface 31a, as viewed in FIG. 1). Each first wiring layer 41 is electrically connected to the associated electrode pad 21 formed on the circuit forming surface 20a of the semiconductor chip 20 via a via-hole 30x penetrating-through the body part 31. Each first wiring layer 41 is also electrically connected to the associated electrode terminal 33 via a via-hole 30y penetrating-through the body part 31.

The first insulating layer 43 is formed on the surface 31a (i.e., under the surface 31a, as viewed in FIG. 1) of the body part 31. The second wiring layer 42 is formed on the first insulating layer 43 (i.e., under the first insulating layer 43, as viewed in FIG. 1) and electrically connected to the first wiring layer 41 via a first via-hole 43x penetrating-through the first insulating layer 43.

For example, Cu-layers may be used as the first wiring layers 41 and the second wiring layers 42. And, e.g., layers made of resin materials such as an epoxy resin may be used as the first insulating layers 43.

A solder resist layer 44 is formed on the first insulating layer 43 (i.e., under the first insulating layer, as viewed in FIG. 1) to cover the second wiring layer 42. The solder resist layer 44 has openings 44x formed to expose the associated second wiring layer 42. The exposed part of the second wiring layer 42 functions as an electrode pad connected to a motherboard and the like.

A metal layer may be formed on the second wiring layer 42 (i.e., under each second wiring layer 42, as viewed in FIG. 1) through the associated opening 44x. For example, a gold (Au) layer, a Ni/Au layer formed by stacking a Ni-layer and an Au-layer in this order, a Ni/Pd/Au layer formed by stacking a Ni-layer, and a Pd-layer, and an Au-layer in this order may be used as the metal layer. Alternatively, an organic solderability preservative (OSP) treatment may be performed on the second wiring layer 42 through the opening 44x, instead of forming the metal layer.

Solder balls 45 are mounted on the second wiring layers 42 (i.e., under the second wiring layer 42, as viewed in FIG. 1) through the openings 44x, respectively.

The wiring layer connected to the semiconductor chip 20 and the wiring layer connected to each electrode terminal 33 may be interconnected each other.

[Manufacturing Method According to First Embodiment]

Next, a method for manufacturing a semiconductor package according to the first embodiment is described. FIGS. 2 to 23 are cross-sectional views exemplifying a process of manufacturing a semiconductor package according to the first embodiment. In FIGS. 2 to 23, the same portion as that illustrated in FIG. 1 is designated with the same reference numeral, and the description thereof is omitted. In FIGS. 2 to 23, semiconductor packages are indicated by turning that indicated in FIG. 1 upside down.

Reference character E shown in each of FIGS. 2 to 23 indicates a position at which the structure is cut after a step illustrated in FIG. 23, in the following description, a method of forming a semiconductor package, in which an opening is formed, a semiconductor chip is arranged therein and a resin portion and a wiring structure are formed, is exemplified. However, in an actual process, plural openings may be formed, plural semiconductor chips may be arranged therein, a resin portion and a wiring structure may be formed, and then it may be cut at a portion E to thereby obtain plural semiconductor packages.

Figure 2:
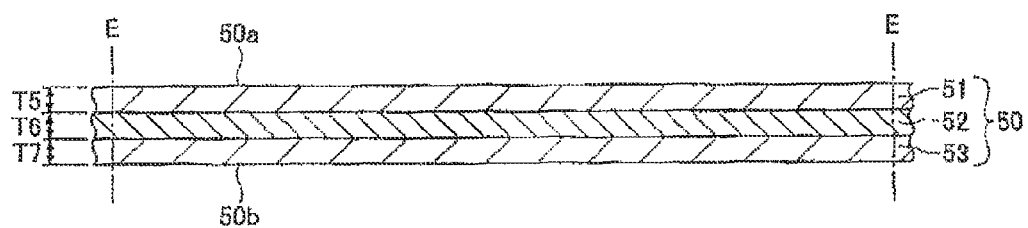
FIGS. 2 to 23 illustrate a process of manufacturing a semiconductor package according to the first embodiment.

First, in a step illustrated in FIG. 2, a supporting body 50 is prepared.

In the supporting body 50, a first layer 51, a second layer 52 and a third layer 53 are sequentially stacked from one surface 50a to an opposite surface 50b. That is, the supporting body 50 is configured by sequentially stacking the first layer 51, the second layer 52 and the third layer 53 such that the first layer 51 is a frontmost layer corresponding to the surface 50a.

Assuming that the surface 50a is a top surface and that the surface 50b is a bottom surface, in the supporting body 50, the second layer 52 is stacked on the third layer 53, and the first layer 51 is stacked on the second layer 52.

Various materials, e.g., metals such as copper (Cu), copper alloys, nickel (Ni), nickel alloys, and Ni—Fe alloys such as a 42-alloy (i.e., an alloy containing nickel and iron (Fe), which is formed such that the weight % of nickel is about 42%), aluminum (Al), aluminum alloys, and ceramics may be used as the first layer 51, the second layer 52 and the third layer 53.

Preferably, the second layer 52 has an etching rate, at which the second layer 52 is etched in the step illustrated in FIG. 4 to be described later, smaller than the etching rate of the first layer 51 for the same etching liquid. That is, preferably, an etching selectivity (a ratio of the etching rate of the first layer 51 to that of the second layer 52) is set high.

Although no specific condition may be required for the third layer 53, e.g., a layer made of the same material as that of the first layer 51 may be used as the third layer 53.

Hereinafter, the supporting body 50 formed by stacking the first layer 51 formed of a Cu metal plate or foil, the second layer 52 formed of a Ni metal plate or foil, and the third layer 53 formed of a Cu metal plate or foil is exemplified.

The thickness T5 of the first layer 51, that T6 of the second layer 52, and that T7 of the third layer 53 are not limited to specific values. For example, when the first layer 51, the second layer 52 and the third layer 53 are, e.g., a Cu-layer, a Ni-layer and a Cu-layer, respectively, the thicknesses T5, T6, and T7 may be set at, e.g., 70 μm, 10 μm, and 70 μm, respectively. The thickness T5 of the first layer 51 is substantially equal to that T3 of each side wall part 32.

A preliminarily-formed three-layer metal foil (i.e., a clad material) of Cu-layer/Ni-layer/Cu-layer may be used as the supporting body. The thickness of the Cu-layer in the metal foil may be changed by electrolytic plating.

A member formed by stacking only the first layer and the second layer may be used as the supporting body.

Figure 3:
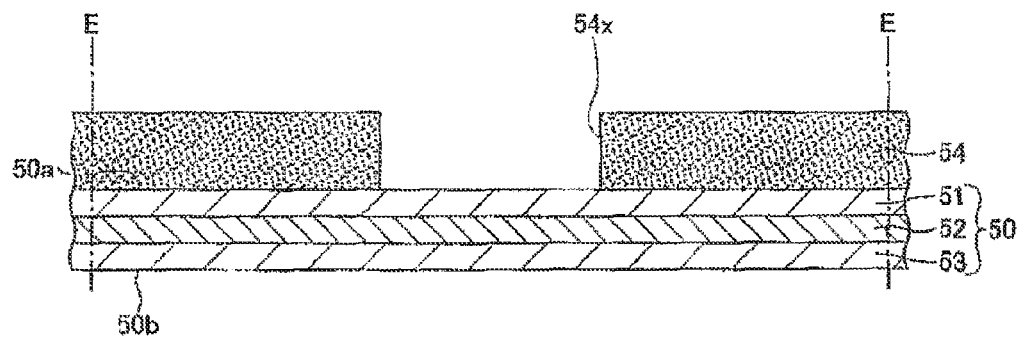

In a step illustrated in FIG. 3, a resist layer 54 having an opening 54x for forming an opening 51x is formed on the supporting body 50.

For example, the resist layer 54 is formed on the surface 50a of the supporting body 50 by applying resist liquid thereto. Then, the opening 54x is formed in the resist layer 54 by exposing and developing. The resist layer 54 having the opening 54x may be formed of a sheet-like laminated resist (i.e., dry film resist). For example, photosensitive resin compositions including, e.g., an epoxy resin and an imide resin may be used as the resist layer 54. The thickness of the resist layer 54 may be set at, e.g., about 50 μm to 100 μm. As viewed from above, the opening 54x may be formed in a portion overlapping with a region on which the semiconductor chip 20 is mounted, and may be formed into, e.g., an 8 millimeters (mm)×8 mm rectangular shape.

Figure 4:
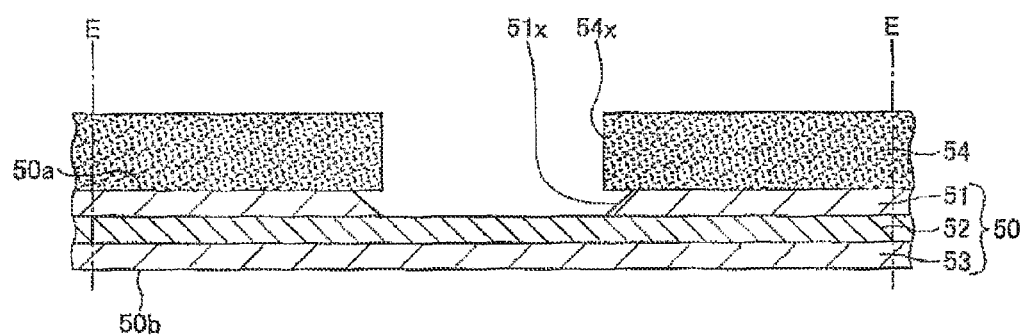

In a step illustrated in FIG. 4, a part of the first layer 51, which corresponds to the opening 54x, is removed by etching, such as wet etching, to thereby form the opening 51x.

Etching of the first layer 51 made of, e.g., Cu is performed with, e.g., ammonium-based alkaline etching liquid. The opening 51x is formed in the first layer 51 such that second layer 52 is exposed therethrough. That is, the second layer 52 is exposed through the bottom surface of the opening 51x.

As described above, preferably, an etching selectivity of the etching rate of the first layer 51 to the second layer 52 may be set high. Etching proceeds until the second layer 52 is exposed. Thus, the depth of each opening 51x is substantially equal to the thickness T5 of the first layer 51, and an in-plane variation of the depth of each opening 51x may be reduced.

For example, in a case where the first layer 51 and the second layer 52 are a Cu-layer and a Ni-layer, respectively, and where an ammonium-based alkaline etching solution, e.g., an ammonium-choride-based alkaline etching solution is used as the etching liquid, it is preferable that the etching selectivity is equal to or more than, e.g., 100.

As illustrated in FIG. 4, the inner wall surface of the opening 51x is not perpendicular but inclined to the surface 50a of the supporting body 50. That is, the opening 51x has a tapered shape in which the depth decreases towards the depth direction thereof, since the first layer 51 is isotropically etched by the etching liquid. As a result, the side wall part 32 to be formed in a step illustrated in FIG. 9 has a tapered shape in which the width thereof increases in a direction from the back surface 20b towards the circuit forming surface 20a of the semiconductor chip 20.

Figure 5:
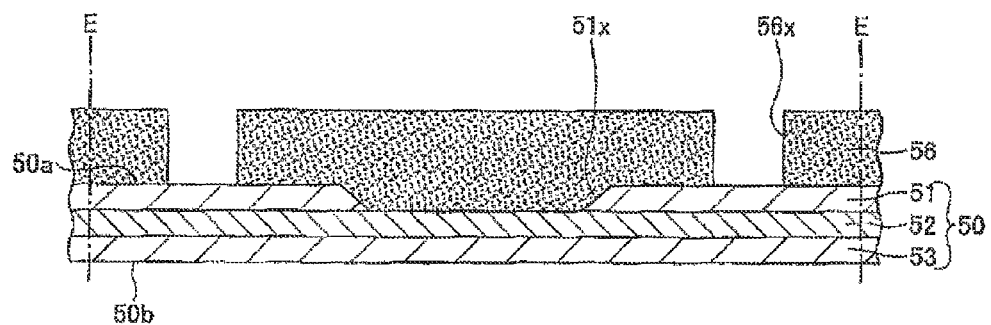

In a step illustrated in FIG. 5, the resist layer 54 is removed. A resist layer 56 having openings 56x for forming the electrode terminals 33 is formed.

First, the resist layer 54 is removed in a peeling step using an alkaline solution, e.g., a sodium hydroxide solution. Then, similarly to a step illustrated in FIG. 3, the resist layer 56 having the openings 56x for forming the electrode terminals 33 is formed on the first layer 51.

Figure 6:
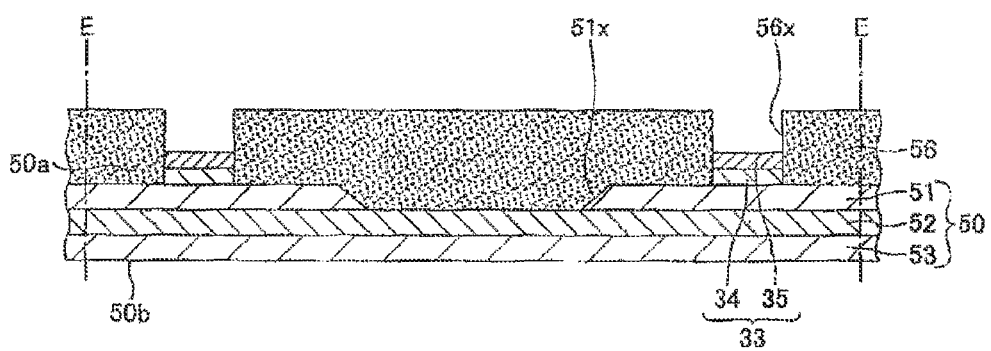

In a step illustrated in FIG. 6, an Au-layer, a Pd-layer and a Ni-layer are stacked in this order on the first layer 51 through the openings 56x, to thereby form the first electrode layers 34. Then, a Cu-layer is stacked on each first electrode layer 34 by electrolytic plating, to thereby form the second electrode layers 35.

Figure 7:
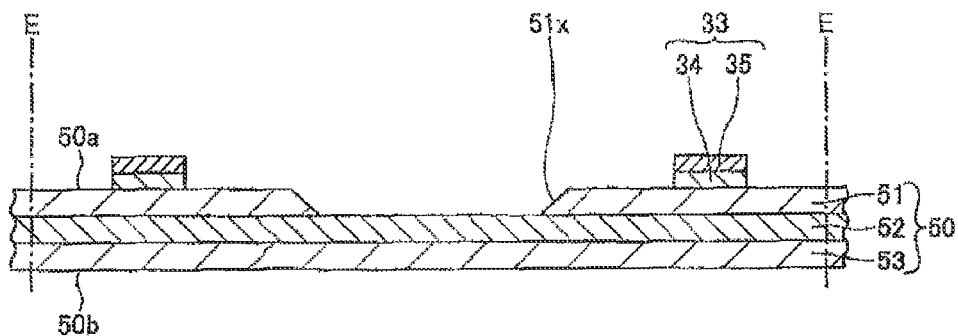

In a step illustrated in FIG. 7, the resist layer 56 is removed, and the electrode terminals 33 are formed, similarly to the step illustrated in FIG. 5.

Figure 8:
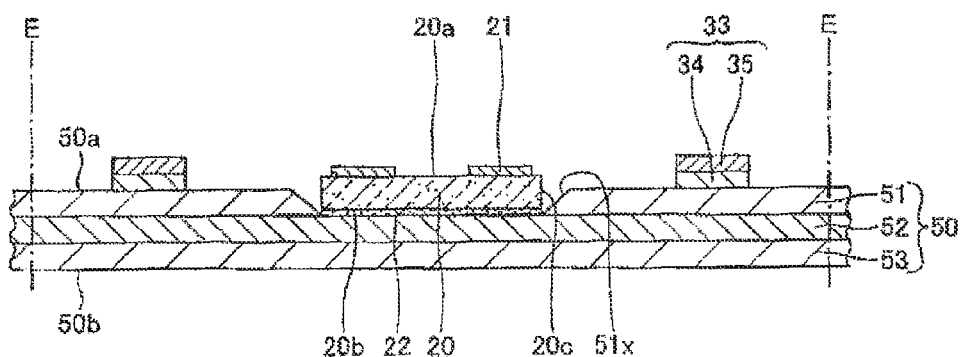

In a step illustrated in FIG. 8, the semiconductor chip 20 is arranged on the second layer 52 through the opening 51x formed in the first layer 51.

For example, the semiconductor chip 20 is arranged so that the back surface 20b thereof touches the second layer 52.

The adhesive layer 22 may preliminarily be formed on the back surface 20b of each semiconductor chip 20. For example, an adhesive such as an epoxy resin may be used as the adhesive layer 22. The thickness of the adhesive layer 22 may be set at, e.g., about 20 μm.

Thus, each semiconductor chip 20 arranged in the openings 51x is pressurized towards the second layer 52, thereby fixing each semiconductor chip 20 onto the second layer 52 via the adhesive layer 22, in a faceup state.

In steps illustrated in FIGS. 9 to 12, the resin portion 30 is formed, and then, the first wiring layer 41 is formed.

Figure 9:
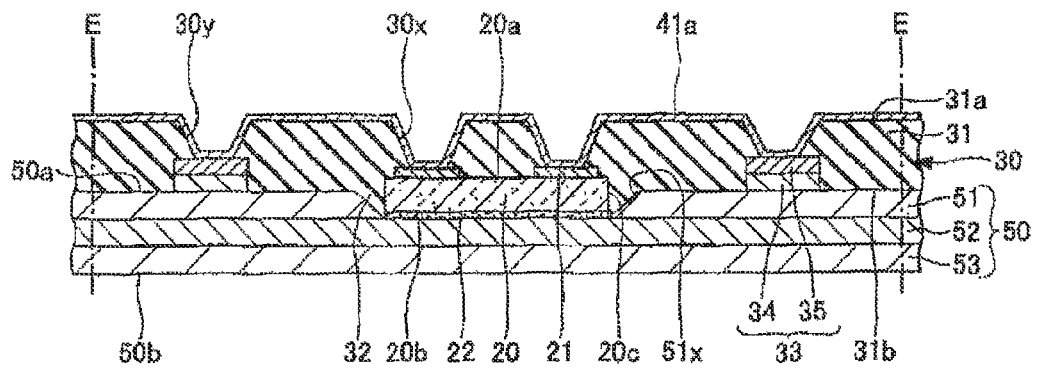

First, in the step illustrated in FIG. 9, the resin portion 30 is formed.

First, the resin portion 30 is formed on the surface 50a of the supporting body 50, i.e., on the first layer 51, to cover each semiconductor chip 20 and each electrode terminal 33. The resin portion 30 is formed by stacking, e.g., epoxy or polyimide resin films thereon, as illustrated in FIG. 9. For example, semi-cured thermosetting epoxy resin films are stacked on the supporting body 50 to cover each semiconductor chip 20 and each electrode terminal 33. Then, the stacked films are heated and pressurized in a vacuum atmosphere to form the resin portion 30.

As described above, the resin portion 30 includes the body part 31 which covers the circuit forming surface 20a of each semiconductor chip 20, and each side wall part 32 which covers the side surface 20e of each semiconductor chip 20.

The thickness T2 of the body part 31 may be set at, e.g., about 50 µm (an applicable range is from 45 µm to 120 µm). The depth of each opening 51x is substantially equal to the thickness T5 of the first layer 51. Since, the in-plane variation of the depth of each opening 51x is reduced, the surface flatness of the surface 31a of the body part 31 facing the wiring structure 40 may be enhanced. The height T3 of each side wall part 32 is substantially equal to that T5 of the first layer 51.

Since the opening 51x has the tapered shape in which the width decreases towards the depth direction, each side wall part 32 has the tapered shape whose width increases in the direction from the back surface 20b towards the circuit forming surface 20a of each semiconductor chip 20.

Next, the via-hole 30x is formed in the body part 31 to penetrate therethrough using a laser processing method or the like, thereby exposing the electrode pad 21 formed on the circuit forming surface 20a. Similarly, the via-hole 30y is also formed in the body part 31 to penetrate therethrough using a laser processing method or the like, thereby exposing the electrode terminals 33.

In this embodiment, the first wiring layer 41 of a copper (Cu) layer or the like is formed by, e.g., a semi-additive method. Hereinafter, a process using the semi-additive method is exemplified with reference to FIGS. 9 to 12.

First in the step illustrated in FIG. 9, a Cu seed layer 41a is formed on the inner walls of the via-holes 30x and 30y, the electrode pad 21 exposed through each via-hole 30x, the electrode terminal 33 exposed through the via-hole 30y, and the surface 31a of the body part 31.

Figure 10:
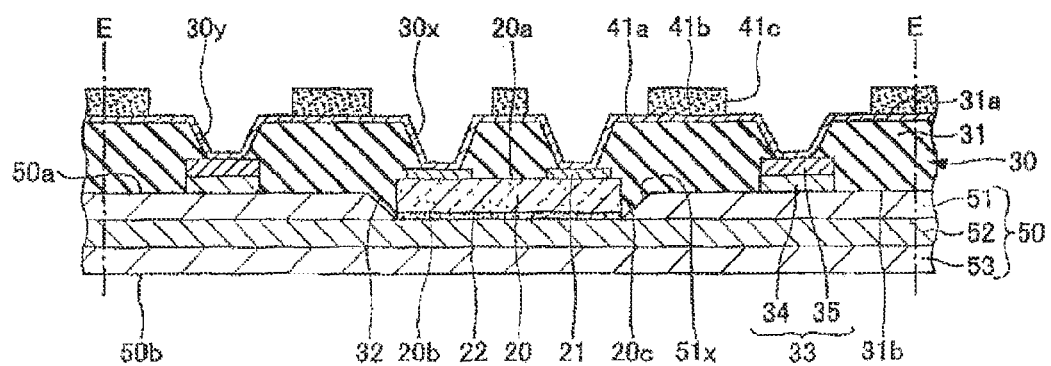

In the step illustrated in FIG. 10, a resist layer 41b is formed on the Cu seed layer 41a. The resist layer 41b has an opening 41c corresponding to the first wiring layer 41.

Figure 11:
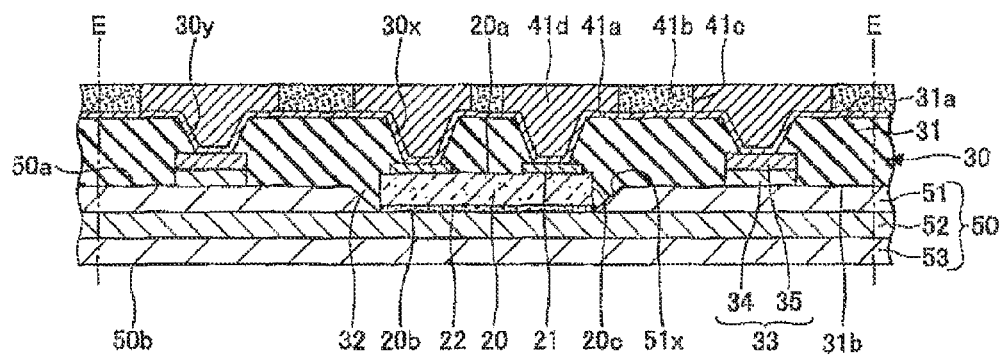

In the step illustrated in FIG. 11, a Cu-layer pattern 41d is formed in each opening 41c of the resist layer 41b by an electrolytic plating method utilizing the Cu seed layer 41a as a power feeding layer.

Figure 12:
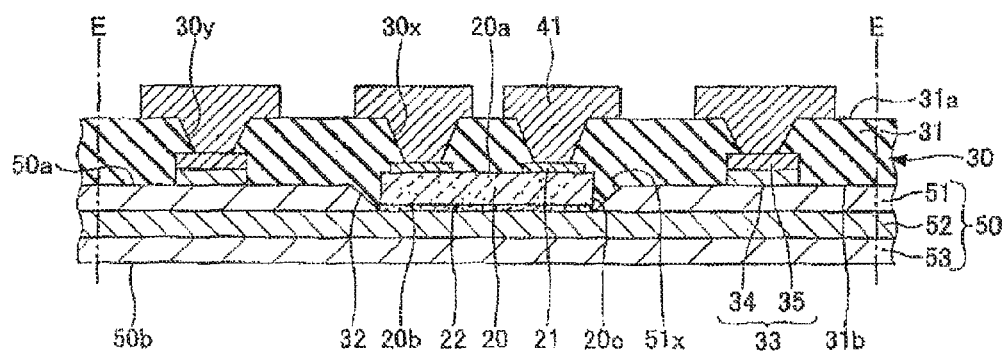

In the step illustrated in FIG. 12, the resist layer 41b is removed, and then, the Cu seed layer 41a is etched using the Cu-layer pattern 41d as a mask. Consequently, the first wiring layers 41 is formed on the surface 31a of the body part 31 so as to be electrically connected not only to each electrode pad 21 on the circuit forming surface 20a through the via-hole 30x but also to each electrode terminal 33 through the via-hole 30y. In other words, the first wiring layer 41 includes a via-conductor provided in each via-hole 30x, another via-conductor provided in the via-hole 30y, and a wiring pattern provided on the resin portion 30. In FIG. 12 or later, the Cu-layer pattern 41d, and the Cu seed layer 41a left in the inner walls of the via-holes 30x and 30y are illustrated integrally with each other as the first wiring layer 41.

Instead of the semi-additive method, various wiring formation methods such as a subtractive method may be used for forming the first wiring layer 41.

Figure 13:
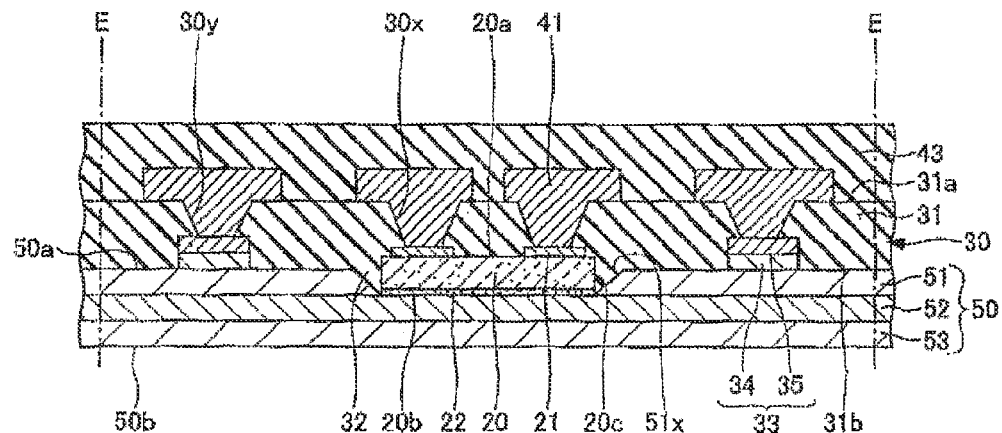

In the step illustrated in FIG. 13, the first insulating layer 43 is formed.

The first insulating layer 43 is formed on the surface 31a of the body part 31 to cover the first wiring layer 41. For example, resin materials such as an epoxy resin and a polyimide resin may be used as the first insulating layer 43. The first insulating layer 43 may be formed by stacking semi-cured thermosetting epoxy resin films on the first wiring layer 41 and the surface 31a of the body part 31 and heating/pressurizing (curing) the stacked thermosetting epoxy resin films in a vacuum atmosphere.

Figure 14:
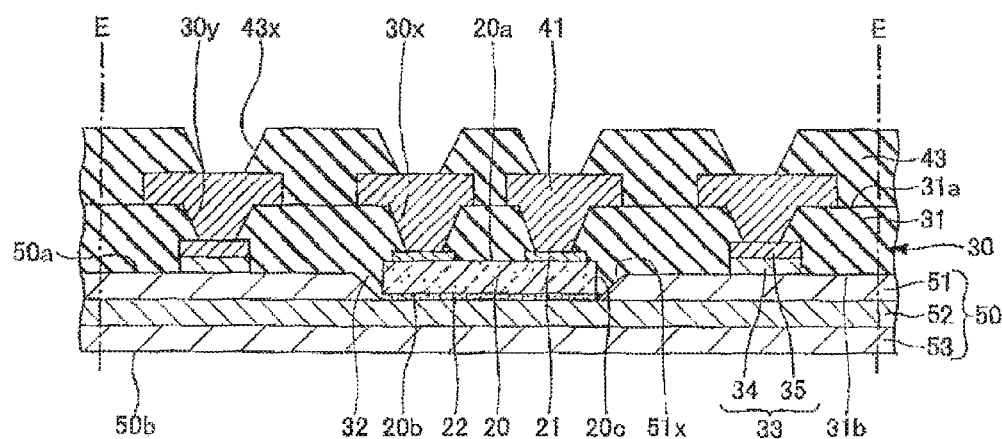

In the step illustrated in FIG. 14, the first via-hole 43x is formed in the first insulating layer 43 to penetrate therethrough and to cover the first wiring layer 41, by a laser processing method or the like.

Alternatively, a photosensitive resin film may be used as the first insulating layer 43, the first via-holes 43x may be formed by patterning through photolithography. A resin film may be provided with an opening by screen printing, and patterning may be performed thereon.

In steps illustrated in FIGS. 15 to 18, the second wiring layer 42 of a copper (Cu) layer or the like is formed by, e.g., the semi-additive method, similarly to the steps illustrated in FIGS. 9 to 12.

Figure 15:
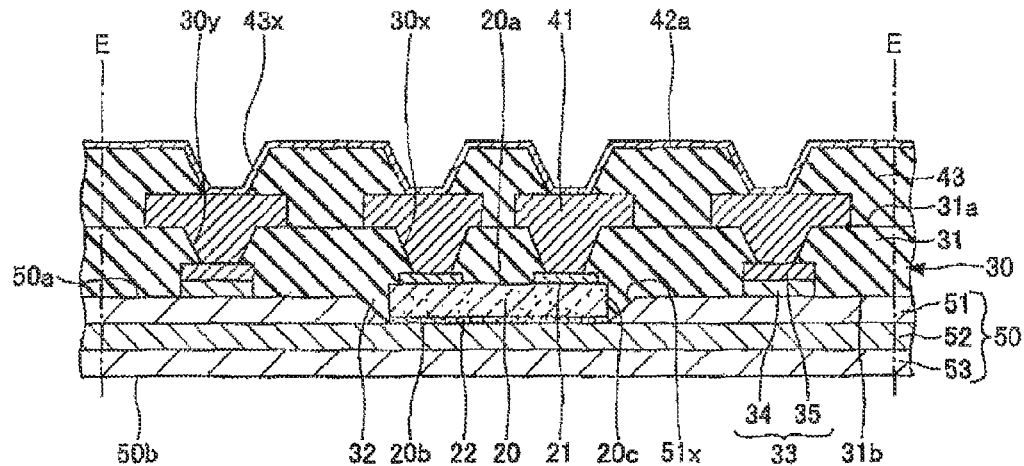

In the step illustrated in FIG. 15, a Cu seed layer 42a is formed on the inner walls of the first via-holes 43x, the first wiring layers 41 exposed through the first via-holes 43x, and the first insulating layers 43, similarly to the step illustrated in FIG. 9.

Figure 16:
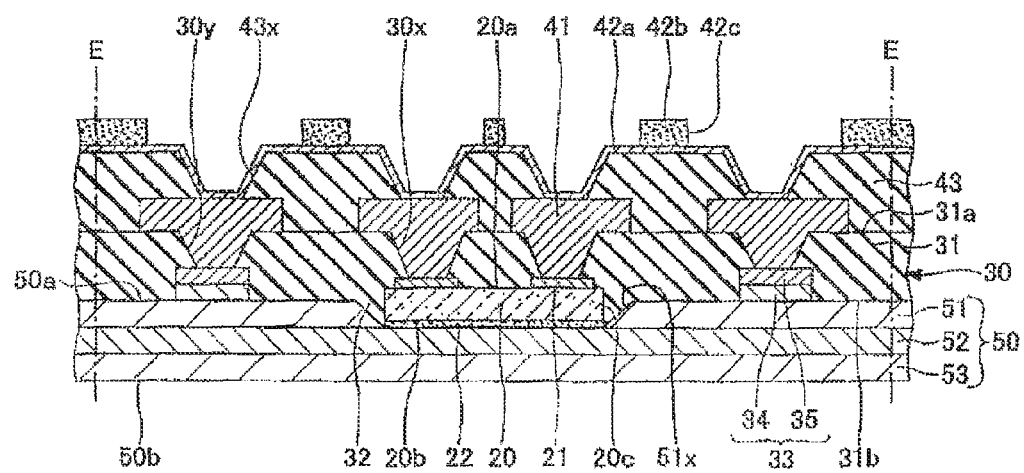

In the step illustrated in FIG. 16, each resist layer 42b having an opening 420 corresponding to the second wiring layer 42 is formed on the Cu seed layer 42a, similarly to the step illustrated in FIG. 10.

Figure 17:
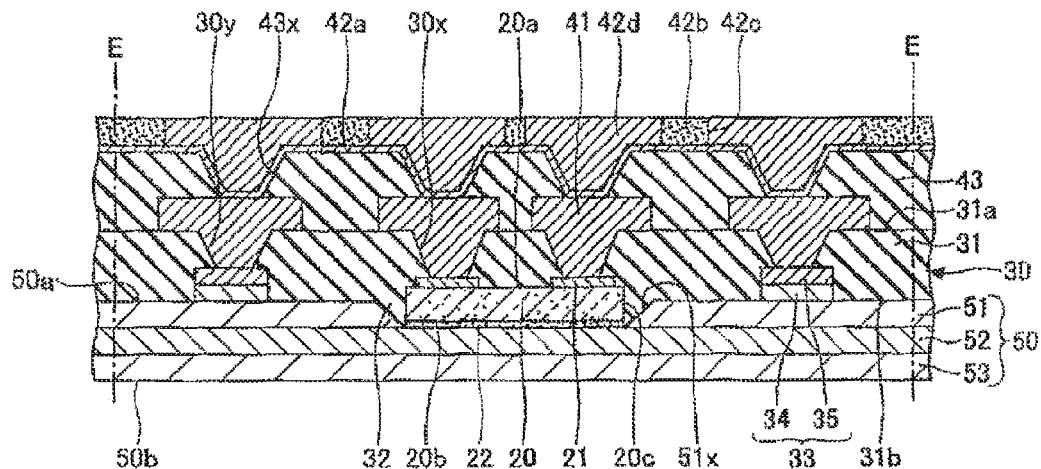

In the step illustrated in FIG. 17, a Cu-layer pattern 42d is formed in the associated opening 42c of the resist layer 42b by, e.g., the electrolytic plating method utilizing the Cu seed layer 42a as a power feeding layer, similarly to the step illustrated in FIG. 11.

Figure 18:
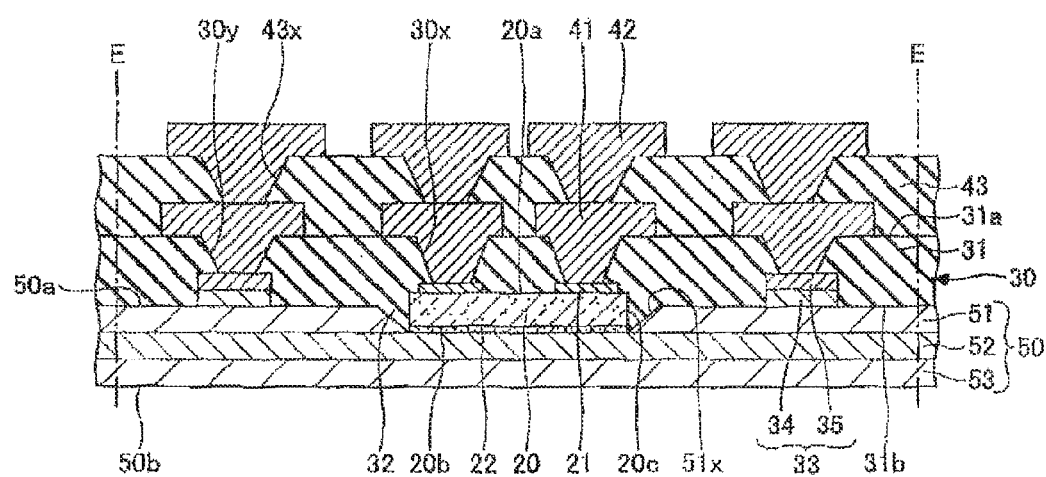

In the step illustrated in FIG. 18, each resist layer 42b is removed, and the Cu seed layer 42a is then etched using the Cu-layer pattern 42d as a mask, similarly to the step illustrated in FIG. 12. Consequently, the second wiring layer 42 is formed on the first insulating layer 43 so as to be electrically connected to the first wiring layer 41 through each first via-hole 43x. In FIG. 18 or later, the Cu-layer pattern 42d, and the Cu seed layer 42a left in the inner walls of the first via-holes 43x are illustrated integrally with each other as the second wiring layer 42.

As a result, given buildup wiring layers are formed on the surface 31a of the body part 31. According to the first embodiment, two buildup wiring layers (i.e., the first wiring layer 41 and the second wiring layer 42) are formed. Alternatively, n buildup wiring layers ("n" is an integer equal to or greater than 1) may be formed.

Figure 19:
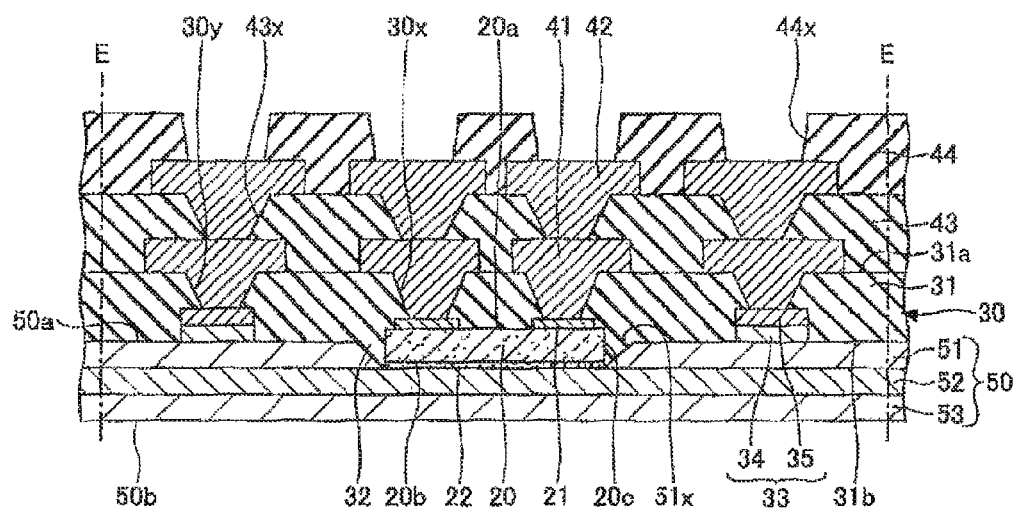

In the step illustrated in FIG. 19, each solder resist layer 44 is formed, and the openings 44x are formed.

Each solder resist layer 44 is formed by applying solder resist onto the associated first insulating layer 43 to cover the second wiring layer 42. Then, the solder resist layer 44 is exposed and developed to form the openings 44x, thereby exposing a part of the second wiring layer 42. For example, photosensitive resin compositions including, e.g., an epoxy resin and an imide resin may be used as the solder resist layer 44. The exposed part of the second wiring layer 42 functions as an electrode pad connected to the motherboard and the like.

A metal layer may be formed on the exposed part of the second wiring layer 42. The metal layer may be formed by, e.g., nonelectrolytic plating. For example, an Au-layer, a Ni/Au layer formed by stacking a Ni-layer and an Au-layer in this order, a Ni/Pd/Au layer formed by stacking a Ni-layer, and a Pd-layer, and an Au-layer in this order may be used as the metal layer. Alternatively, an OSP treatment may be performed on the exposed part of the second wiring layer 42, instead of forming the metal layer.

Figure 20:
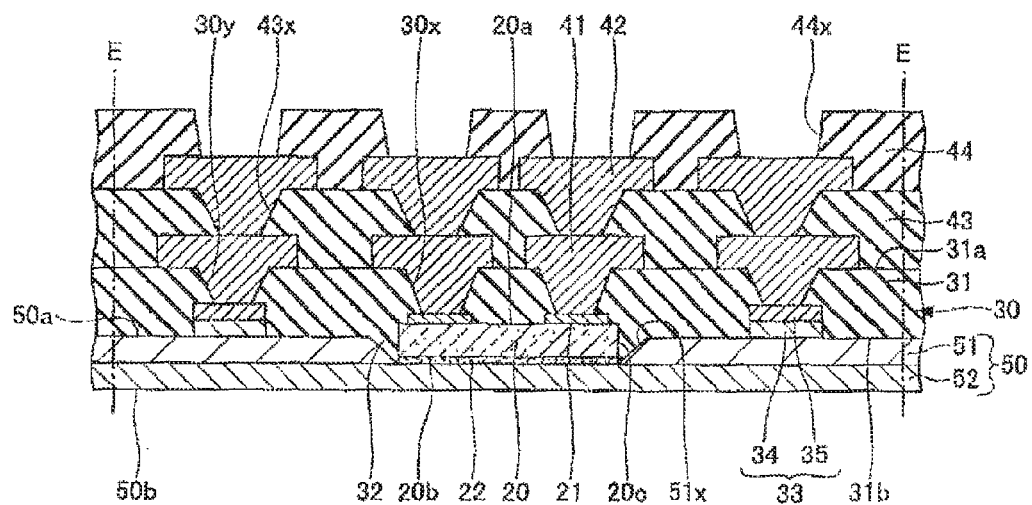

In the step illustrated in FIG. 20, the third layer 53 of the supporting body 50 is removed. When the third layer 53 is made of, e.g., Cu, the third layer 53 may be removed by etching using ammonium-based alkaline etching liquid, e.g., ammonium-chloride-based alkaline etching liquid.

Figure 21:
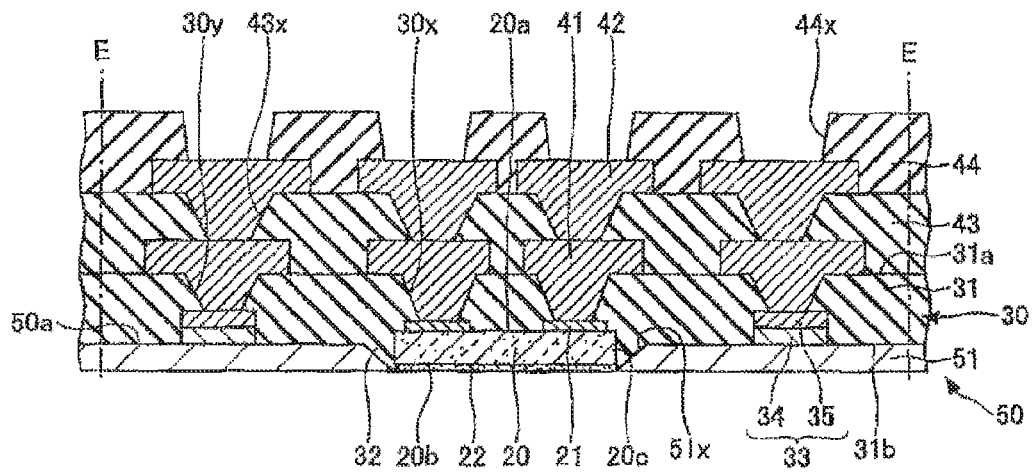

In the step illustrated in FIG. 21, the second layer 52 of the supporting body 50 is removed. When the second layer 52 is made of, e.g., Ni, the second layer 52 may be removed by etching using, e.g., sulfuric-acid-based etching liquid or hydrogen-peroxide-based etching liquid.

Figure 22:
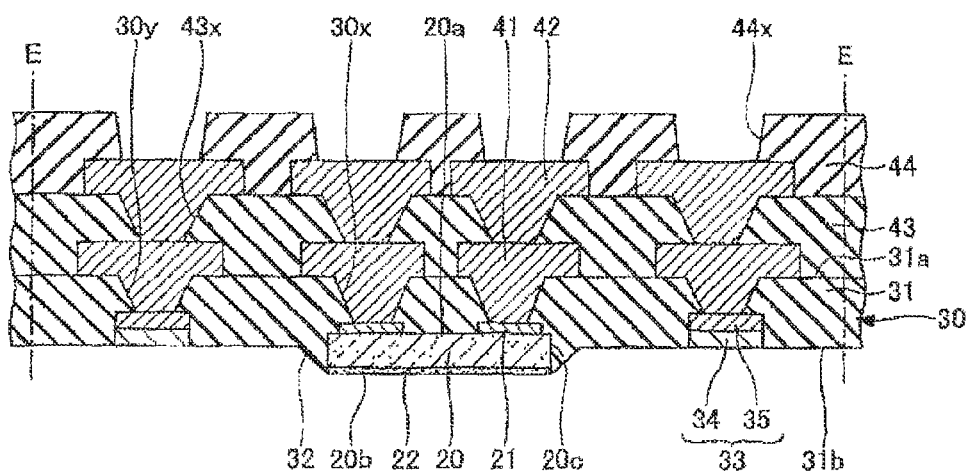

In the step illustrated in FIG. 22, the first layer 51 of the supporting body 50 is removed. When the first layer 51 is made of, e.g., Cu, the first layer 51 may be removed by etching using ammonium-based alkaline etching liquid, e.g., ammonium-chloride-based alkaline etching liquid.

Figure 23:
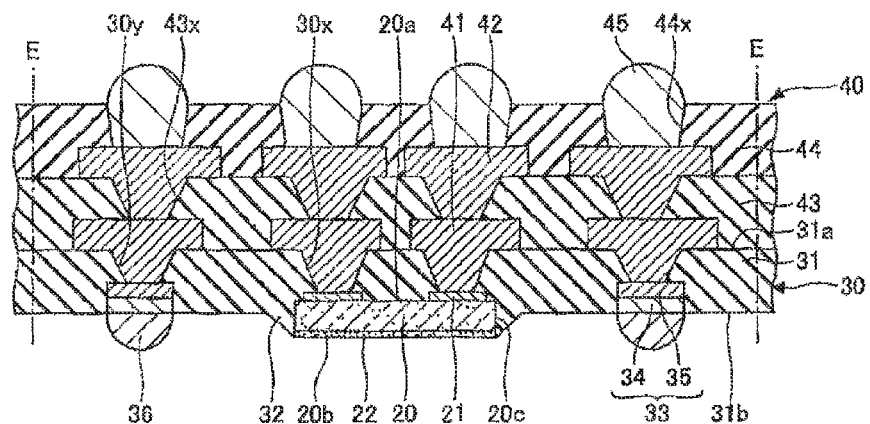

In the step illustrated in FIG. 23, the solder balls 45 are mounted on the second wiring layers 42 through the openings 44x, and the solder bumps 36 are mounted on the electrode terminals 33.

Then, a structure illustrated in FIG. 23 is individualized by being cut at, e.g., the position E, which is located between adjacent semiconductor chips. Consequently, the semiconductor package 10 illustrated in FIG. 1 is completed.

[Another Example of Structure According to First Embodiment]

As another example, another semiconductor chip may be mounted on the semiconductor package 10 according to the first embodiment. Further, the space between the semiconductor chips may be filled with an underfill resin. Hereinafter, the other examples of the semiconductor package according to the first embodiment are described with reference to FIGS. 24 and 25.

Figure 24:
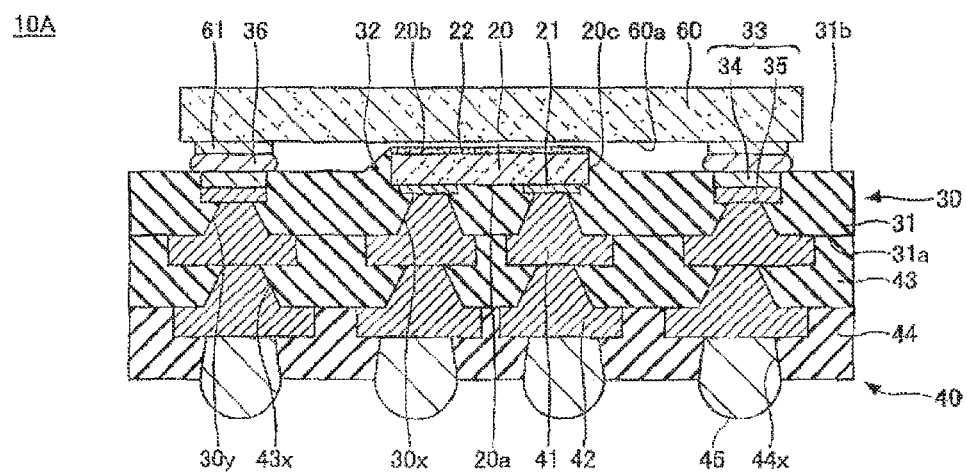
FIGS. 24 and 25 cross-sectionally illustrate other examples of the semiconductor package according to the first embodiment.
Figure 25:
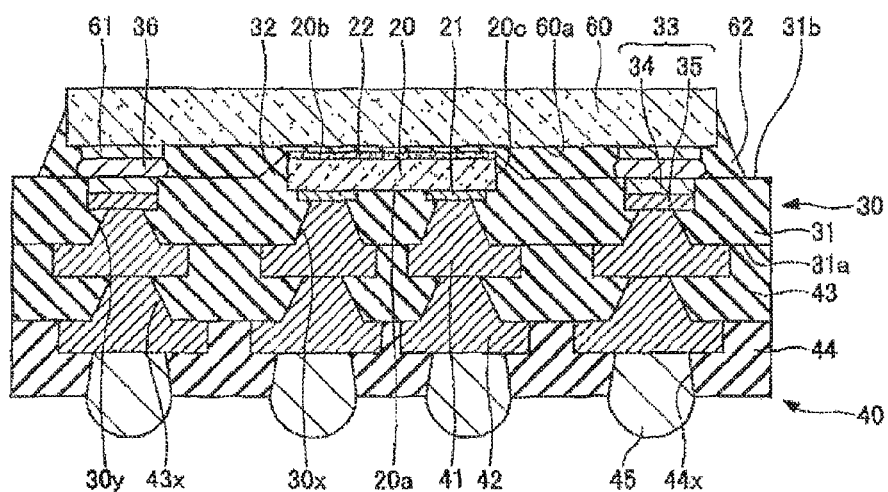

FIGS. 24 and 25 are cross-sectional views respectively exemplifying other examples of the semiconductor package according to the first embodiment.

Referring to FIG. 24, a semiconductor package 10A includes a second semiconductor chip 60 mounted on the semiconductor package 10 according to the first embodiment at a side of the semiconductor chip 20. Thus, the semiconductor package 10A includes the semiconductor chip 20, the resin portion 30, the wiring structure 40 and the second semiconductor chip 60.

The second semiconductor chip 60 includes a semiconductor substrate, e.g., a Si-substrate, similarly to the semiconductor chip 20. In the second semiconductor chip 60, a semiconductor integrated circuit (not shown) and an electrode pad 61 are formed on a surface (circuit forming surface) 60a thereof facing the wiring structure 40.

The circuit forming surface 60a of the second semiconductor chip 60 faces the surface 31b of the body part 31 of the resin portion 30. The electrode pads 61 of the second semiconductor chip 60 are electrically connected to the electrode terminals 33 via the associated solder bumps 36.

The size of the second semiconductor chip 60 may be set to be larger than that of the semiconductor chip 20. For example, the size of the second semiconductor chip 60 as viewed from above may be set at, e.g., about 10 mm×10 mm, and the thickness thereof may be set at, e.g., about 75 μm (an applicable range is from 50 μm to 120 μm).

Other electronic components such as a semiconductor package, a capacitor and an inductor may be mounted thereon, instead of the second semiconductor chip 60.

Referring to FIG. 25, in the semiconductor package 10B, as compared with the above semiconductor package 10A, the space between the semiconductor chip 20 and the second semiconductor chip 60 is filled with an underfill resin 62.

In the semiconductor package 10B, each side wall part 32 has a tapered shape in which the width thereof increases in the direction from the back surface 20b towards the circuit forming surface 20a of the semiconductor chip 20.

For example, a comparative example in which the side wall part 32 doesn't have a tapered shape and the width of the side wall part 32 is substantially constant in a direction from the back surface 20b to the circuit forming surface 20a of the semiconductor chip 20 is assumed. In the comparative example, when the space between the semiconductor chip 20 and the second semiconductor chip 60 is filled with the underfill resin 62, bubbles generated around the side wall part 32 may be retained therearound, and it is difficult to escape therefrom towards circumference thereof. As a result, the generated bubbles may be entrained into the underfill resin 62.

On the other hand, the side wall part 32 of the semiconductor package 101B has the tapered shape. Thus, when the space between the semiconductor chip 20 and the second semiconductor chip 60 is filled with the underfill resin 62, the generated bubbles are easy to escape and difficult to be entrained into the underfill resin 62.

According to the first embodiment, in the process of the manufacturing a semiconductor package using the supporting body formed by stacking the first layer and the second layer, the opening is formed in the first layer to expose the second layer. Consequently, a semiconductor package is obtained, which may be reduced in thickness and superior in surface flatness of the resin portion covering the semiconductor chip.

(First Modification of First Embodiment)

In a first modification of the first embodiment, a frame-like portion is formed on a surface opposite to a surface of the body part, with which the wiring structure comes in contact. The description of components, which are common to the first embodiment, is omitted. The following description is focused on components thereof, which differ from those of the first embodiment.

[Structure According to First Modification of First Embodiment]

Figure 26:
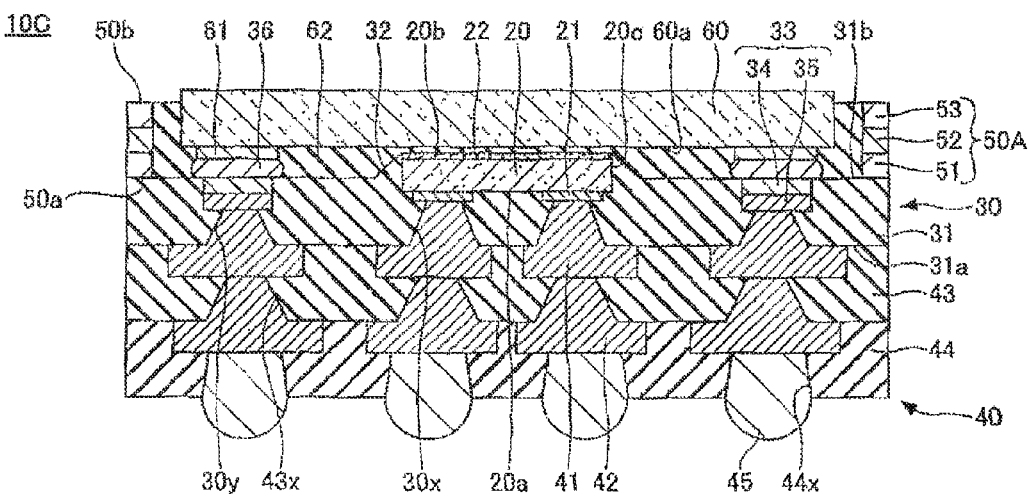
FIG. 26 cross-sectionally illustrates a semiconductor package according to a first modification of the first embodiment.

FIG. 26 cross-sectionally illustrates a semiconductor package according to the first modification of the first embodiment. Referring to FIG. 26, a semiconductor package 10C according to the first modification differs from the semiconductor package 10B illustrated in FIG. 25 in that the frame-like portion 50A is formed on the surface 31b of the body part 31, which is opposite to the wiring structure 40. Hereinafter, the description of parts, which are the same as those of the semiconductor package 10B, is omitted, and the following description is focused on parts, which differ from those of the semiconductor package 10B.

Structures of the semiconductor chip 20, the resin portion 30, the wiring structure 40 and the second semiconductor chip 60 are the same between the semiconductor package 10C according to the first modification of the first embodiment and the semiconductor package 10B according to the first embodiment (another example). Thus, the description of such components is omitted.

The frame-like portion 50A is formed on the surface 31b of the body part 31 to surround the semiconductor chip 20 and the electrode terminals 33 at the circumferential edge thereof.

The frame-like portion 50A prevents the underfill resin from flowing out to the circumferential edge when filling the space with the underfill resin.

The frame-like portion 50A may be a left part of the supporting body 50 remained in the semiconductor package manufacturing process. In this case, the supporting body 50 is utilized not only to support the semiconductor chip 20 but also to prevent the underfill resin from flowing out.

[Manufacturing Method According to First Modification of First Embodiment]

A manufacturing method for a semiconductor package according to the first modification of the first embodiment is similar to that of the first embodiment illustrated in FIGS. 2 to 23, except the steps illustrated in FIGS. 20 to 23.

According to the first modification of the first embodiment, after the step illustrated in FIG. 19, steps illustrated in FIGS. 27 to 30 are performed, instead of steps illustrated in FIGS. 20 to 23.

Figure 27:
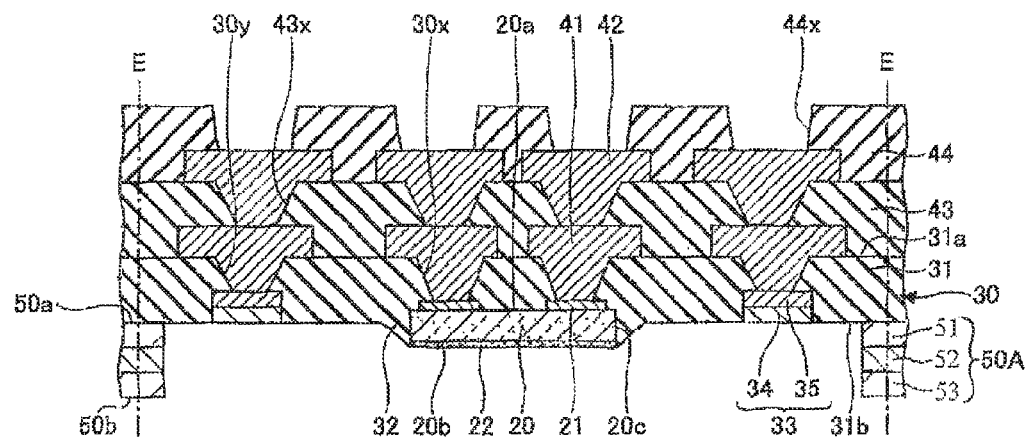
FIGS. 27 to 30 illustrate a process of manufacturing the semiconductor package according to the first modification of the first embodiment.

FIGS. 27 to 30 are cross-sectional views exemplifying the steps for manufacturing a semiconductor package according to the first the modification of the first embodiment. In FIGS. 27 to 30, each component which is the same as that illustrated in FIG. 26 is designated with the same reference numeral used to designate an associated component illustrated in FIG. 26. Reference character E illustrated in FIGS. 27 to 30 indicates a position at which the structure is cut after the step illustrated in FIG. 30. In FIG. 27, the semiconductor package is indicated by turning that indicated in FIG. 26 upside down.

In the step illustrated in FIG. 27, the third layer 53, the second layer 52, and the first layer 51 are removed so that the frame-like portion 50A surrounding the semiconductor chip 20 and the electrode terminals 33 is left on the surface 31b of the body part 31.

For example, similarly to the step illustrated in FIG. 3, a resist layer having an opening for forming the frame-like portion 50A is formed on the surface 50b of the supporting body 50. Then, processing similar to that in the steps illustrated in FIGS. 20 to 22 is performed. The frame-like portion 50A is formed by sequentially removing the third layer 53, the second layer 52 and the first layer 51 through the openings.

Figure 28:
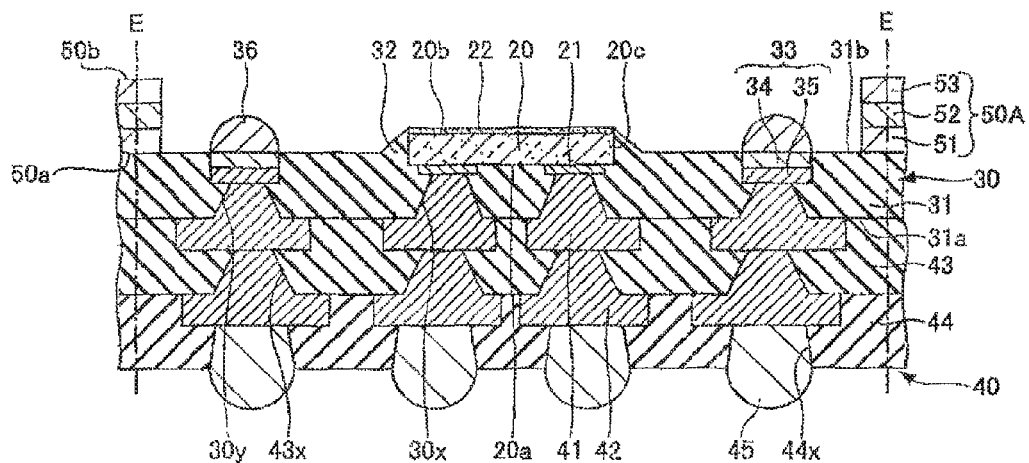

In the step illustrated in FIG. 28, the solder balls 45 are mounted, and the solder bumps 36 are mounted, similarly to the step illustrated in FIG. 23.

Figure 29:
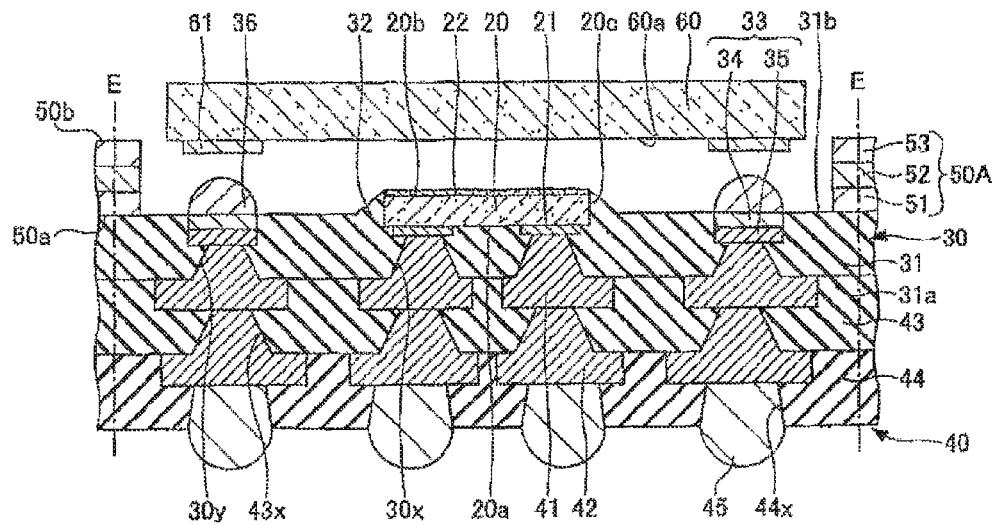

In the step illustrated in FIG. 29, the second semiconductor chip 60 is mounted such that the circuit forming surface 60a faces the surface 31b of the body part 31 of the resin portion 30, and that each electrode pad 61 overlaps with the associated electrode terminal 33 as viewed from above. In that state, each electrode pad 61 is electrically connected to the associated electrode terminal 33 via the associated solder bump 36 by performing heat treatment.

Figure 30:
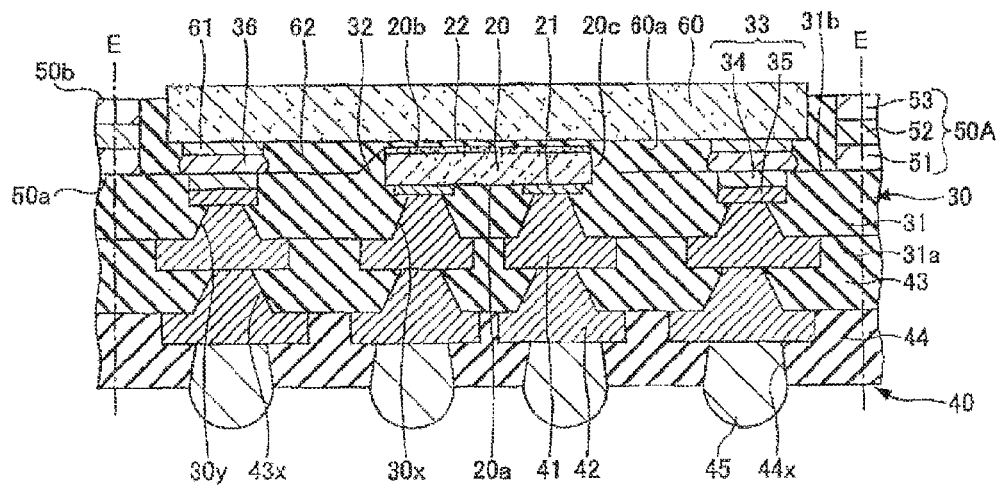

In the step illustrated in FIG. 30, the space between the semiconductor chip 20 and the second semiconductor chip 60 is filled with the underfill resin 62. Since the frame-like portion 50A surrounding the semiconductor chip 20 and the electrode terminals 33 is formed on the surface 31b of the body part 31, the underfill resin 62 is prevented from flowing out towards the circumferential edge. As a result, an amount of the underfill resin 62 for filing the space may be controlled to a predetermined value, by adjusting the dimensions of the opening in the frame-like portion 50A.

Also in the first modification of the first embodiment, in the process of manufacturing a semiconductor package using the supporting body obtained by stacking the first layer and the second layer, the opening is formed in the first layer to expose the second layer. Consequently, a semiconductor package is obtained, which may be reduced in thickness and may have superior surface flatness of the resin portion covering the semiconductor chip.

(Second Modification of First Embodiment)

In a second modification of the first embodiment, a supporting body is configured only by the first layer and the second layer. The description of components, which are common to the first embodiment, is omitted. The following description is focused on components thereof, which differ from those of the first embodiment.

The structures are the same between the semiconductor package according to the second modification of the first embodiment and the semiconductor package according to the first embodiment, and thus, the description of the structure is omitted.

[Manufacturing Method According to Second Modification of First Embodiment]

FIGS. 31 to 34 are cross-sectional views exemplifying the steps for manufacturing a semiconductor package according to the second modification of the first embodiment. In FIGS. 31 to 34, each component which is the same as that illustrated in FIG. 1 is designated with the same reference numeral used to designate an associated component illustrated in FIG. 1. Reference character E illustrated in FIGS. 31 to 34 indicates a position at which the structure is cut after the step illustrated in FIG. 34. In FIGS. 31 to 34, the semiconductor package is indicated by turning that indicated in FIG. 1 upside down.

A manufacturing method for a semiconductor package according to the second modification of the first embodiment is similar to that of the first embodiment illustrated in FIGS. 2 to 23, except that a supporting body doesn't have a third layer. The description of steps common to the steps illustrated in FIGS. 2 to 23 is omitted.

Figure 31:
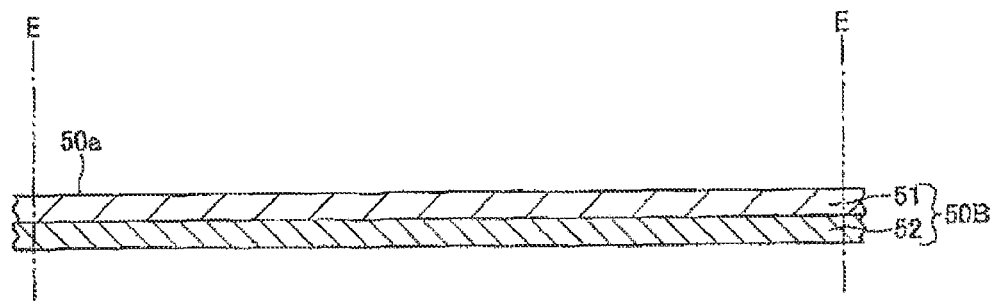
FIGS. 31 to 34 illustrate a process of manufacturing the semiconductor package according to a second modification of the first embodiment.

First, in the step illustrated in FIG. 31, a supporting body 50B is prepared, similarly to the step illustrated in FIG. 2.

Here, the supporting body 50B is obtained by stacking the first layer 51 and the second layer 52.

Assuming that the surface 50a is a top surface, in the supporting body 50B, the first layer 51 is stacked on the second layer 52.

Similarly to the first embodiment, preferably, the etching selectivity (the ratio of the etching rate of the first layer 51 to that of the second layer 52) is set high. In the following description, the supporting body 50B formed by stacking the first layer 51 formed of a Cu metal plate or foil and the second layer 52 formed of a Ni metal plate or foil is exemplified.

Figure 32:
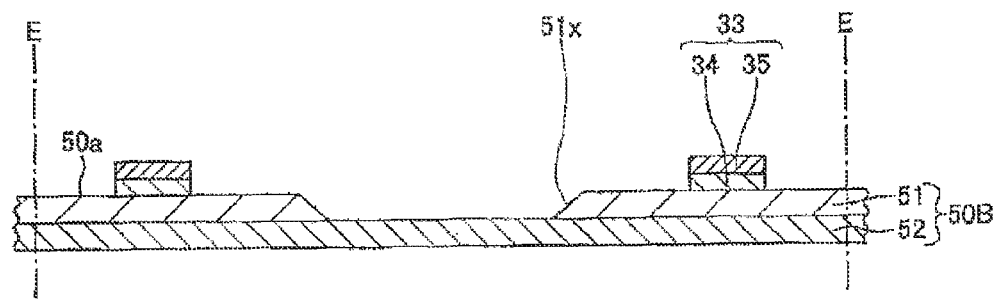

In a step illustrated in FIG. 32, the opening 51x is formed in the first layer 51 to expose the second layer 52, similarly to the steps illustrated in FIGS. 3 and 4. Then, the electrode terminal 33 is formed on the first layer 51, similarly to the steps illustrated in FIGS. 5 to 7.

Figure 33:
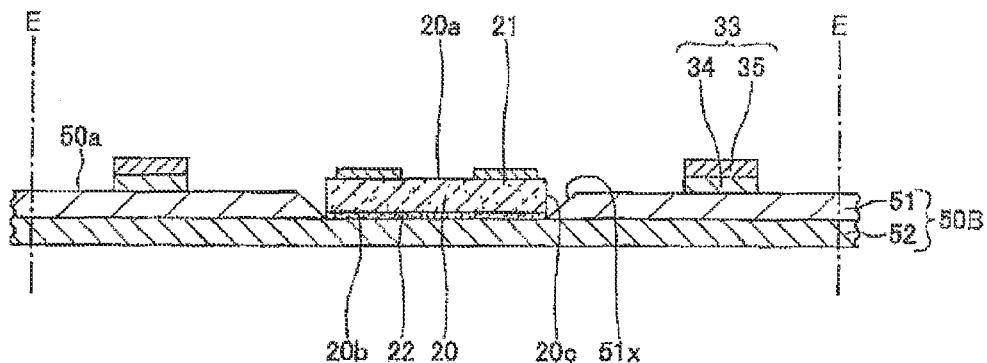

In a step illustrated in FIG. 33, the semiconductor chip 20 is placed in the opening 51x, similarly to the step illustrated in FIG. 8.

Figure 34:
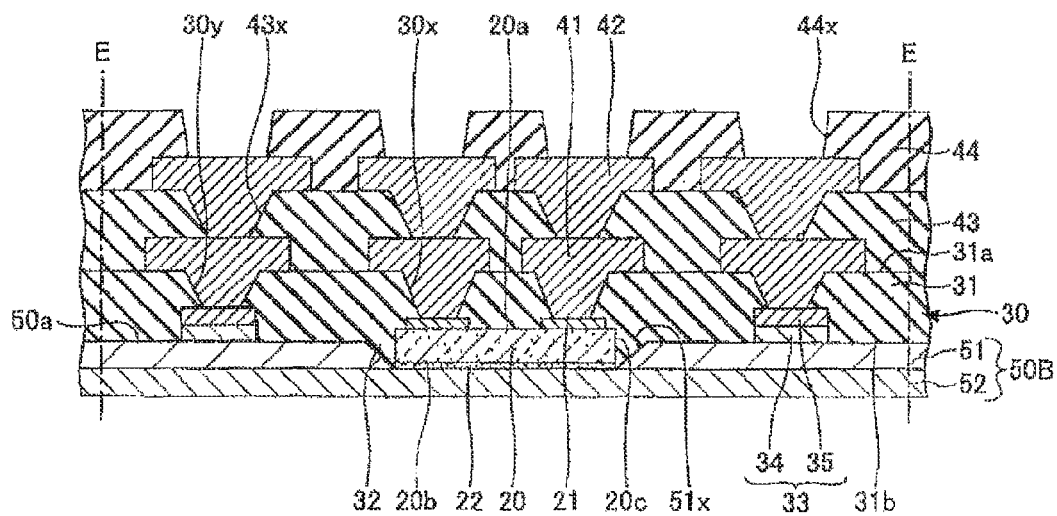

In a step illustrated in FIG. 34, the resin portion 30, the first wiring layer 41, the first insulating layer 43, the second wiring layer 42 and the solder resist layer 44 are sequentially formed, similarly to the steps illustrated in FIGS. 9 to 19. A structure obtained by performing the step illustrated in FIG. 34 is the same as the structure obtained by performing the step illustrated in FIG. 20.

Then, the second layer 52 and the first layer 51 of the supporting body 50B are removed by performing processing similar to that in the steps illustrated in FIGS. 21 and 22. Next, the solder balls 45 are mounted, and the solder bumps 36 are mounted, by performing processing similar to that in the step illustrated in FIG. 23. Then, the structure is cut at, e.g., the position E, so that the semiconductor packages are individualized. Consequently, the semiconductor package 10 illustrated in FIG. 1 is completed.

(Second Embodiment)

In a second embodiment, the first layer is left in the supporting body. The description of components, which are common to the first embodiment, is omitted. The following description is focused on components thereof, which differ from those of the first embodiment.

[Structure According to Second Embodiment]

Figure 35:
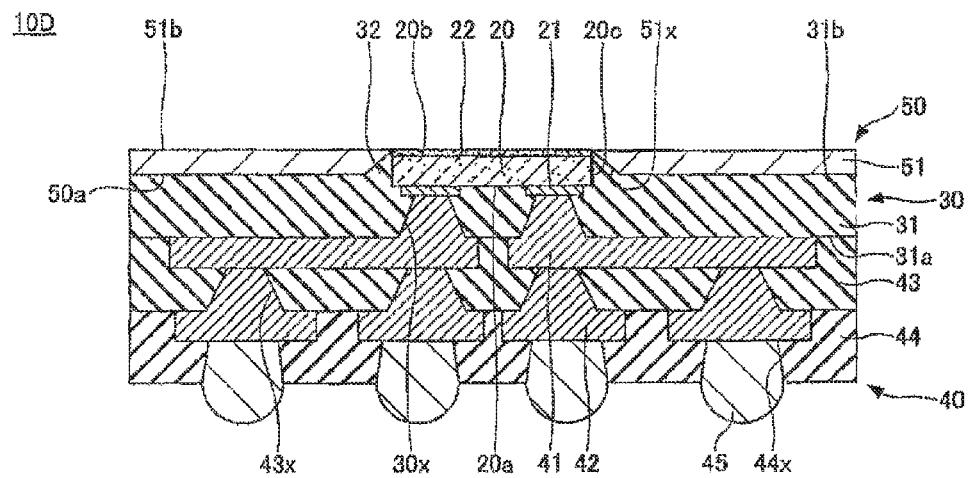
FIG. 35 cross-sectionally illustrates a semiconductor package according to a second embodiment.

FIG. 35 cross-sectionally illustrates a semiconductor package according to the second embodiment. Referring to FIG. 35, a semiconductor package 10D according to the second embodiment differs from the semiconductor package 10 illustrated in FIG. 1 in that the first layer 51 of the supporting body 50 is left on the surface 31b of the body part 31. Hereinafter, the description of parts, which are the same as those of the semiconductor package 10, is omitted, and the following description is focused on parts, which differ from those of the semiconductor package 10.

The semiconductor package 10D has the same structure as that of the semiconductor package 10, except that the electrode terminals 33 and the via-hole 30y are not formed, and that the semiconductor package 10D has the first layer 51.

The resin portion 30 includes the body part 31 and each side wall part 32. Each side wall part 32 has the same structure as that of the side wall part 32 of the semiconductor package 10. The body part 31 has the same structure as that of the body part 31 of the semiconductor package 10, except that neither the electrode terminal 33 nor the via-hole 30y is formed on the surface 31b of the body part 31.

The first layer 51 is formed on the surface 31b of the body part 31 to touch the side wall part 32. The first layer 51 of the supporting body 50 is not removed in a semiconductor package manufacturing process which will be described below. Thus, the first layer 51 is left thereon. Accordingly, a surface 51b of the first layer 51 opposite to a surface touching the body part 31 are flush with the back surface 20b of the semiconductor chip 20.

Even in the second embodiment, the supporting body may be configured by stacking only the first layer and the second layer, similarly to the second modification of the first embodiment.

Also in the second embodiment, the first layer is provided on the surface of the body part, which is opposite to the wiring structure, to touch the side wall part as the supporting body. Accordingly, the resin portion may be reduced in thickness in a region surrounding the semiconductor chip. In addition, the semiconductor package may be reinforced.

[Manufacturing Method According to Second Embodiment]

FIGS. 36 to 39 are cross-sectional views exemplifying steps of a process of manufacturing the semiconductor package according to the second embodiment. In FIGS. 36 to 39, each component which is the same as that illustrated in FIG. 35 is designated with the same reference numeral used to designate an associated component illustrated in FIG. 35. Reference character E illustrated in FIGS. 36 to 39 indicates a position at which the structure is cut after the step illustrated in FIG. 39. In FIGS. 36 to 39, the semiconductor package is indicated by turning that indicated in FIG. 35 upside down.

A manufacturing method for a semiconductor package according to the second embodiment is similar to that of the first embodiment illustrated in FIGS. 2 to 23, except that the electrode terminals 33 and the via-holes 30y are not formed, and that the first layer 51 is left. The description of steps common to the steps illustrated in FIGS. 2 to 23 is omitted.

Figure 36:
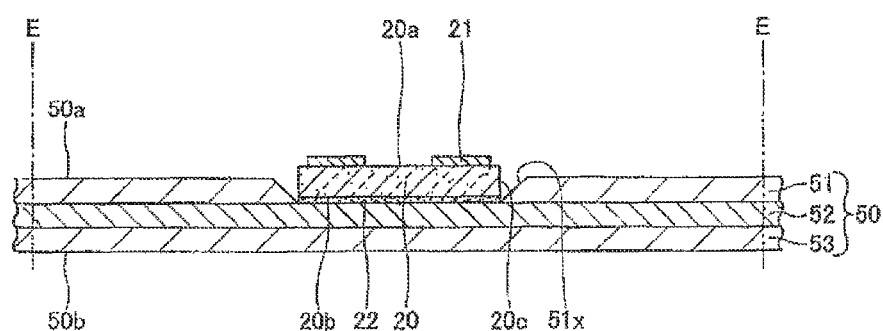
FIGS. 36 to 39 illustrate a process of manufacturing a semiconductor package according to the second embodiment.

First, in the step illustrated in FIG. 36, the supporting body 50 is prepared. Then, the opening 51x is formed in the first layer 51 of the prepared supporting body 50, and the semiconductor chip 20 is placed in the formed opening 51x, similarly to the steps illustrated in FIGS. 2 to 8. In this embodiment, among the steps illustrated in FIGS. 2 to 8, the steps illustrated in FIGS. 5 to 7, are not performed. Accordingly, the electrode terminals 33 are not formed on the supporting body 50.

In a manufacturing process according to the second embodiment, the supporting body 50 configured by the first layer 51 formed of, e.g., a Cu metal foil, the second layer 52 formed of e.g., a Ni metal foil, and the third layer 53 formed of, e.g., a Cu metal foil may be used, similarly to the first embodiment.

Figure 37:
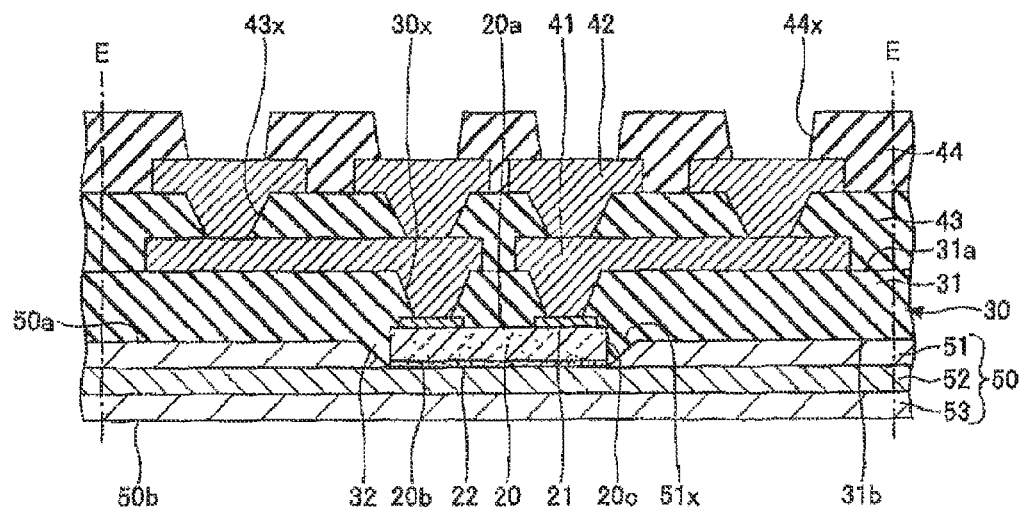

In the step illustrated in FIG. 37, the resin portion 30, the first wiring layer 41, the first insulating layer 43, the second wiring layer 42 and the solder resist layer 44 are sequentially formed, similarly to the steps illustrated in FIGS. 9 to 19. However, unlike the step illustrated in FIG. 9, the via-hole 30y is not formed while the via-hole 30x is formed.

Figure 38:
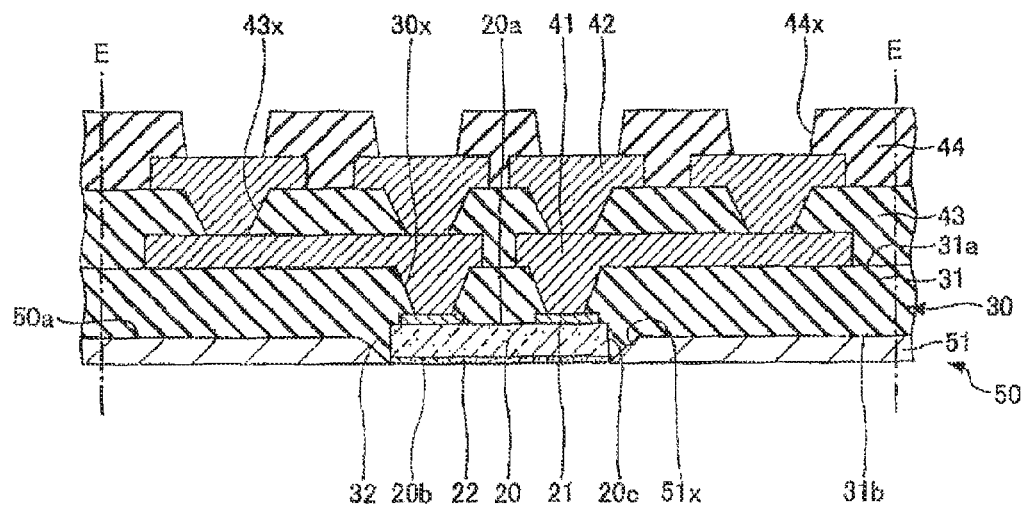

In the step illustrated in FIG. 38, processing similar to that in the steps illustrated in FIGS. 20 and 21 is performed. Thus, the third layer 53 and the second layer 52 of the supporting body 50 are removed.

Figure 39:
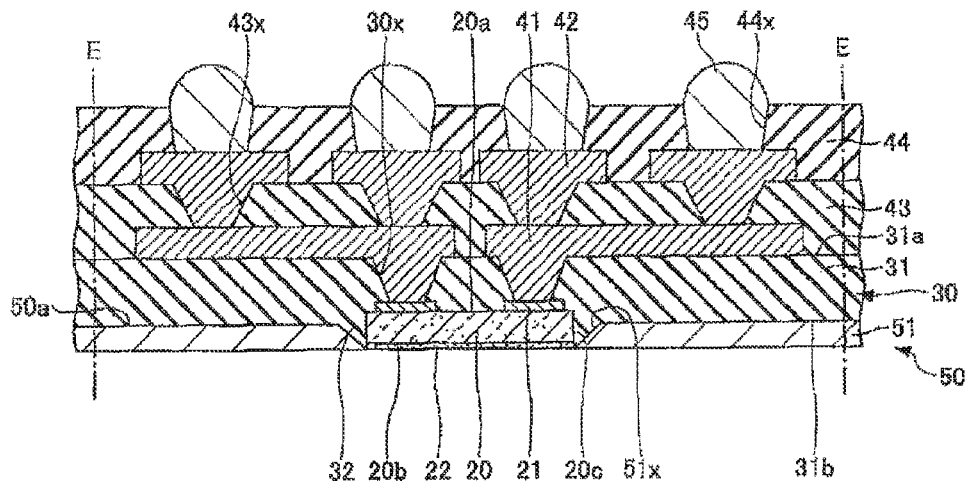

In the step illustrated, in FIG. 39, the solder balls 45 are mounted by performing processing to be performed in the step illustrated in FIG. 23. In addition, the structure is cut at, e.g., the position E, so that the semiconductor packages are individualized. Consequently, the semiconductor package 10D illustrated in FIG. 35 is completed.

Even according to the second embodiment, in the process of manufacturing a semiconductor package using the supporting body configured by stacking the first layer and the second layer, the opening is formed in the first layer to expose the second layer. Consequently, a semiconductor package is obtained, which may be reduced in thickness and may have superior surface flatness of the resin portion covering the semiconductor chip.

(Third Embodiment)

In a third embodiment, the entire supporting body is left. The description of components, which are common to the second embodiment, is omitted, and the following description is focused on components, which differ from those of the second embodiment.

[Structure According to Third Embodiment]

Figure 40:
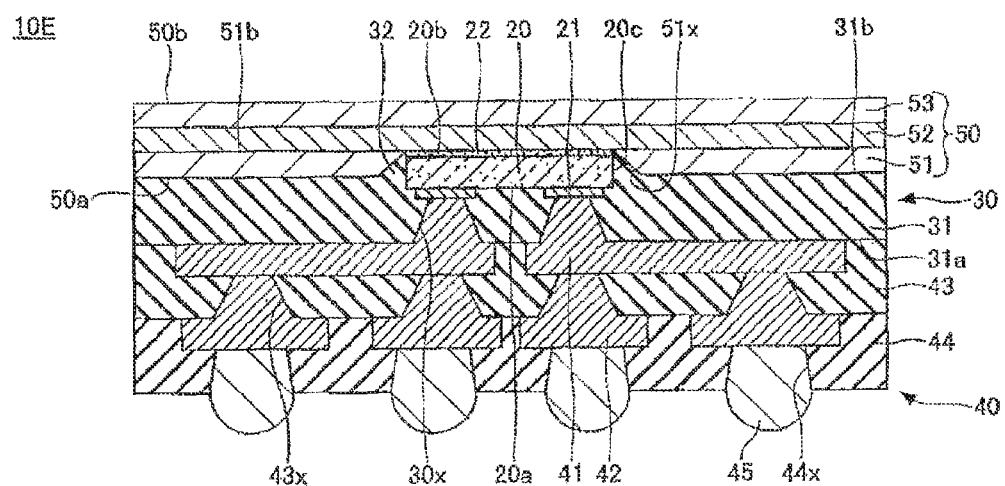
FIG. 40 cross-sectionally illustrates a semiconductor package according to a third embodiment.

FIG. 40 cross-sectionally illustrates a semiconductor package according to the third embodiment. Referring to FIG. 40, a semiconductor package 10E differs from the semiconductor package 10D illustrated in FIG. 35 in that the second layer 52 and the third layer 53 are left on the surface 31b of the body part 31. Hereinafter, the description of parts, which are the same as those of the semiconductor package 10D, is omitted, and the following description is focused on parts, which differ from those of the semiconductor package 10D.

The semiconductor package 10E has the same structure as that of the semiconductor package 10D, except that the semiconductor package 10E has the second layer 52 and the third layer 53.

The second layer 52 and the third layer 53 are formed on the surface 51b of the first layer 51, which is opposite to the surface 31b of the body part 31 and the back surface 20b of the semiconductor chip 20, respectively, in this order. The second layer 52 and the third layer 53 are not removed in the process of manufacturing a semiconductor package that will be described below. Thus, the second layer 52 and the third layer 53 of the supporting body 50 are left.

Similarly to the semiconductor package 10D according to the second embodiment, the semiconductor package 10E may use the supporting body 50 formed by stacking the first layer 51 formed of a Cu metal foil the second layer 52 formed of a Ni metal foil, and the third layer 53 formed of a Cu metal foil.

Even according to the third embodiment, the supporting body configured by stacking only the first layer and the second layer may be used, similarly to the second modification of the first embodiment.

According to the third embodiment, the second layer and the third layer are respectively provided on the surface of the first layer, which is opposite to the body part and the semiconductor chip. Accordingly, in a region surrounding the semiconductor chip, the resin portion may be reduced in thickness. In addition, the semiconductor package may be more reinforced.

For example, if the first layer 51, the second layer 52 and the third layer 53 are formed by plating, time taken to manufacture a semiconductor package may be made long, and the in-plane variation of the thickness of each layer may be increased.

On the other hand, according to the third embodiment, the supporting body 50 includes the first layer 51 formed of a Cu metal foil, the second layer 52 formed of a Ni metal foil, and the third layer 53 formed of a Cu metal foil. The Cu metal foil and the Ni metal foil are subjected to, e.g., rolling processing. Thus, layers of uniform thickness may easily be formed in a short time. Accordingly, the manufacturing time of a semiconductor package may be reduced, and the surface flatness of the resin portion may be enhanced.

[Manufacturing Method According to Third Embodiment]

A manufacturing method for a semiconductor package according to the third embodiment is similar to that of the second embodiment illustrated in FIGS. 36 to 39, except steps illustrated in FIGS. 38 and 39. The description of similar steps is omitted.

Figure 41:
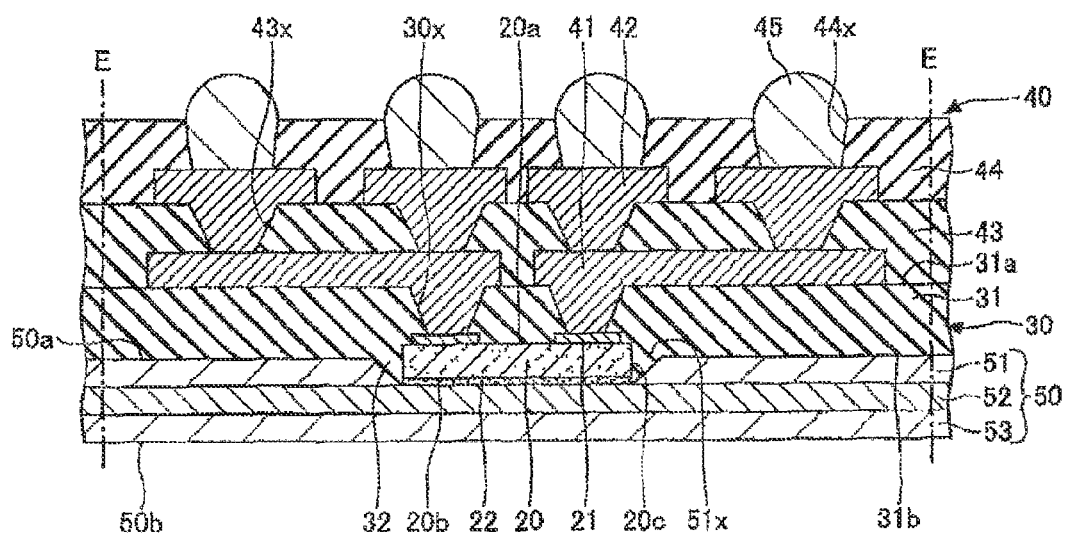
FIG. 41 illustrates a process of manufacturing a semiconductor package according to the third embodiment.

According to the third embodiment, after a step illustrated in FIG. 37, a step illustrated in FIG. 41 is performed, instead of the steps illustrated in FIGS. 38 and 39.

FIG. 41 illustrates a process of manufacturing a semiconductor package according to the third embodiment. In FIG. 41, each component which is the same as that illustrated in FIG. 40 is designated with the same reference numeral used to designate an associated component illustrated in FIG. 40. Reference character E illustrated in FIG. 41 indicates a position at which the structure is cut after the step illustrated in FIG. 41. In FIG. 41, the semiconductor package is indicated by turning that indicated in FIG. 40 upside down.

In the step illustrated in FIG. 41, the solder balls 45 are mounted by performing a step similar to that illustrated in FIG. 23. In addition, the structure is cut at, e.g., the position E, so that the semiconductor packages are individualized. Consequently, the semiconductor package 10E illustrated in FIG. 40 is completed.

(Fourth Embodiment)

In a fourth embodiment, a supporting body of metal-layer/resin-layer/metal-layer is used to manufacture a semiconductor package, instead of the supporting body of three metal layers (Cu layer/Ni-layer/Cu-layer) used in the first embodiment.

The structures are the same between the semiconductor package according to the fourth embodiment and the semiconductor package according to the first embodiment, and thus, the description of the structure is omitted.

[Manufacturing Method According to Fourth Embodiment]

FIGS. 42 to 48 are cross-sectional views exemplifying the steps for manufacturing a semiconductor package according to the fourth embodiment. In FIGS. 42 to 48, each component which is the same as that illustrated in FIG. 1 is designated with the same reference numeral used to designate an associated component illustrated in FIG. 1. Reference character E illustrated in FIGS. 42 to 48 indicates a position at which the structure is cut after the step illustrated in FIG. 48. In FIGS. 42 to 48, the semiconductor package is indicated by turning that indicated in FIG. 1 upside down.

A manufacturing method for a semiconductor package according to the fourth embodiment is similar to that of the first embodiment illustrated in FIGS. 2 to 23, except that a second layer of a supporting body is formed of a resin, not a metal. The description of steps common to the steps illustrated in FIGS. 2 to 23 is omitted.

Figure 42:
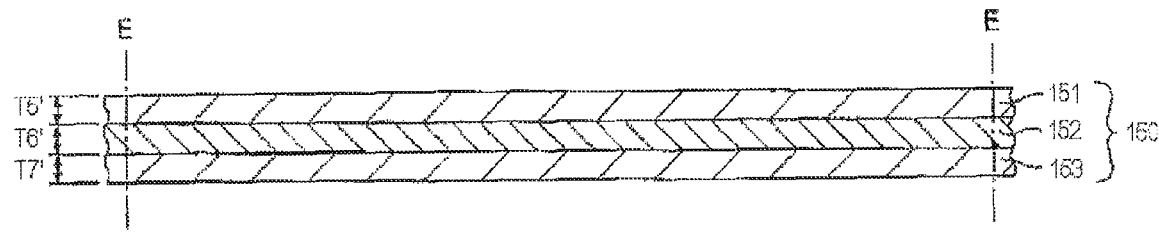
FIGS. 42 to 48 illustrate a process of manufacturing the semiconductor package according to a fourth embodiment.

First, in the step illustrated in FIG. 42, a supporting body 150 is prepared, similarly to the step illustrated in FIG. 2. Here, the supporting body 150 is formed by stacking a first layer 151 formed of a metal (such as Cu), a second layer 152 formed of a resin (such as an epoxy resin, a polyimide resin and the other kind of resin) and a third layer 153 funned of a metal (such as Cu). Similarly to the first embodiment, preferably, the etching selectivity (the ratio of the etching rate of the first layer 151 to that of the second layer 152) is set high.

For example, the supporting body 150 is firmed by stacking Cu metal foils on both surfaces of a semi-cured thermosetting epoxy resin film, heating/pressurizing it, and curing the epoxy resin film. Although there is no specific limitation, the thickness T5' of the first layer 151, that T6' of the second layer 152, and that T1' of the third layer 153 may be set at, e.g., 70 μm, 30 μm, and 70 μm, respectively.

Figure 43:
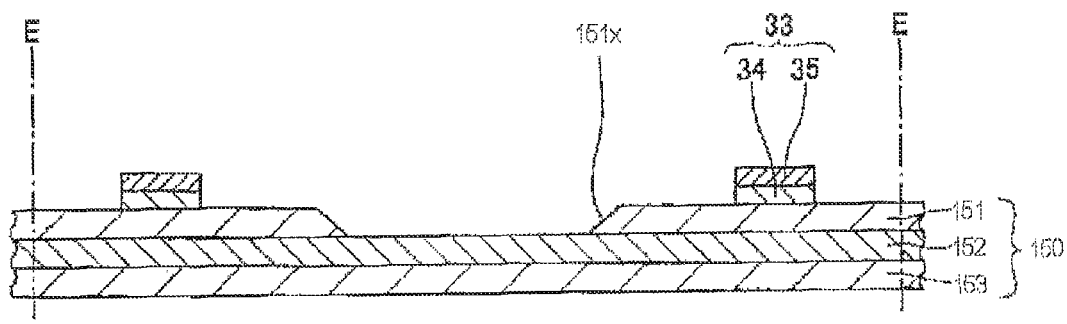

In a step illustrated in FIG. 43, an opening 151x is formed in the first layer 151 to expose the second layer 152, similarly to the steps illustrated in FIGS. 3 and 4. Then, the electrode terminal 33 is formed on the first layer 151, similarly to the steps illustrated in FIGS. 5 to 7.

Figure 44:
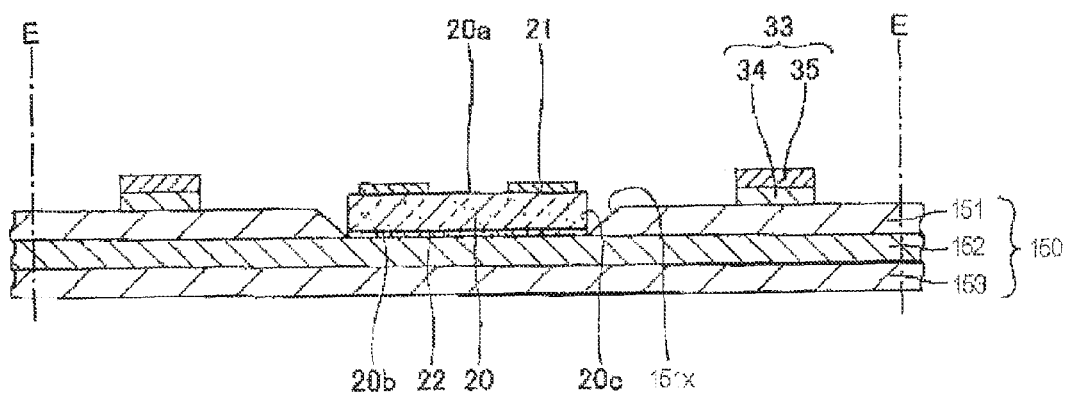

In a step illustrated in FIG. 44, the semiconductor chip 20 is placed in the opening 151x, similarly to the step illustrated in FIG. 8.

Figure 45:
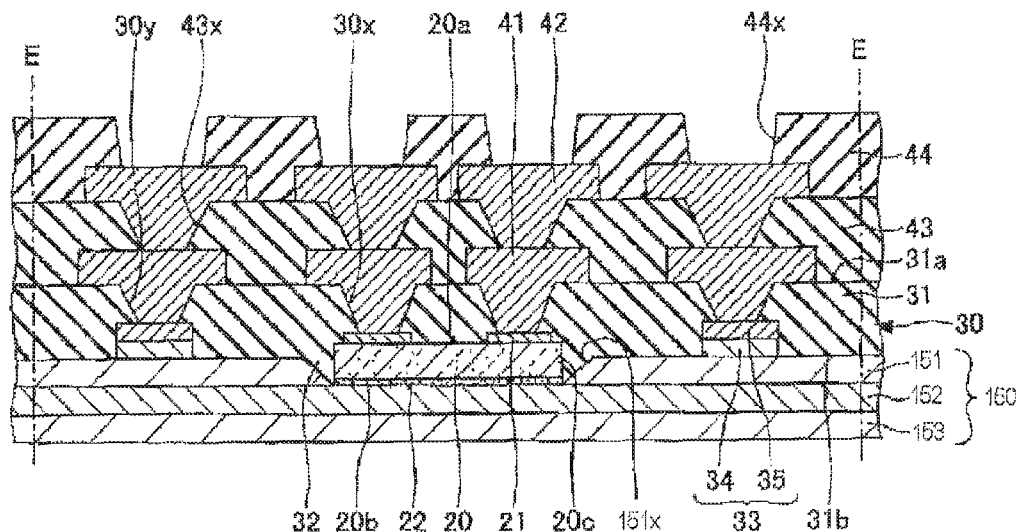

In a step illustrated in FIG. 45, the resin portion 30, the first wiring layer 41, the first insulating layer 43, the second wiring layer 42 and the solder resist layer 44 are sequentially formed, similarly to the steps illustrated in FIGS. 9 to 19.

Figure 46:
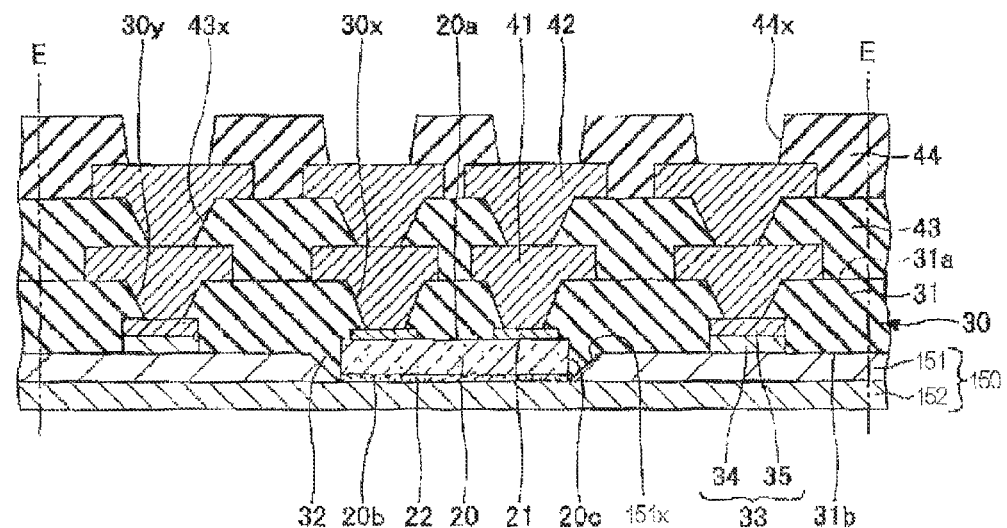

In the step illustrated in FIG. 46, the third layer 153 of the supporting body 150 is removed, similarly to the step illustrated in FIG. 20.

Figure 47:
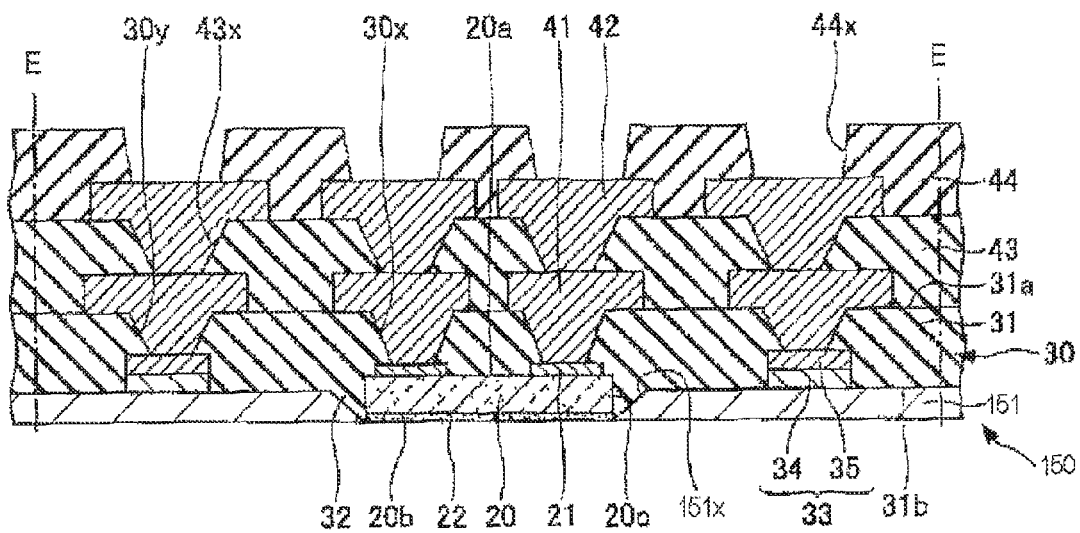

In the step illustrated in FIG. 47, the second layer 152 of the supporting body 150 is removed, similarly to the step illustrated in FIG. 21. Here, when the second layer 152 is made of a resin, such as an epoxy resin, the second layer 152 may be removed by a mechanical processing, such as a polishing process, a grinding process and a blasting process.

Figure 48:
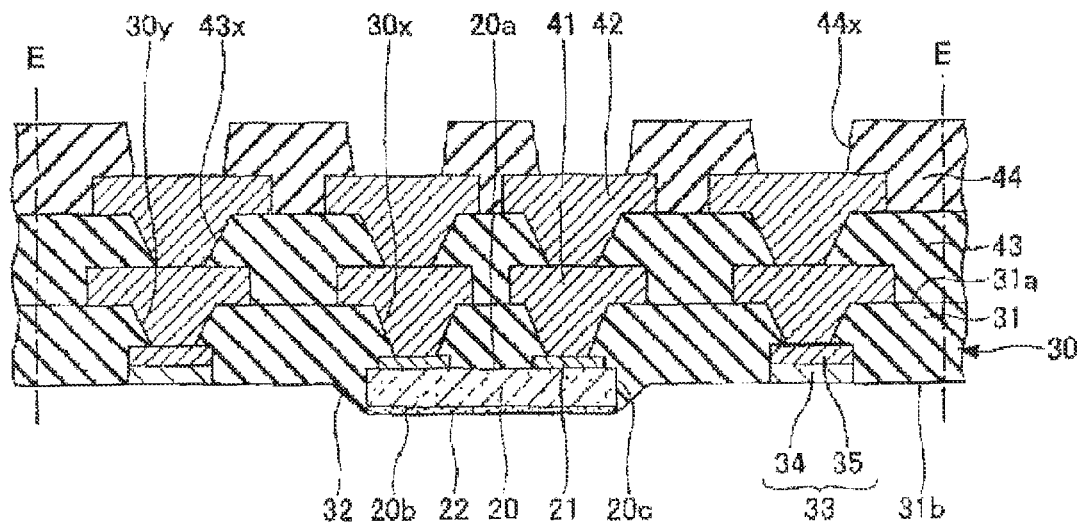

In the step illustrated in FIG. 48, the first layer 151 of the supporting body 150 is removed, similarly to the step illustrated in FIG. 22.

A structure obtained by performing the step illustrated in FIG. 48 is the same as the structure obtained by performing the step illustrated in FIG. 22.

Then, the solder balls 45 are mounted, and the solder bumps 36 are mounted, by performing processing similar to that in the step illustrated in FIG. 23. Then, the structure is cut at, e.g., the position F, so that the semiconductor packages are individualized. Consequently, the semiconductor package which is the same with the semiconductor package 10 illustrated in FIG. 1 is completed. The supporting body 150 of this embodiment may be applied to the other embodiments.

While the embodiments are exemplified, the invention is not limited thereto, and various modification/substitution may be adapted thereto without departing from the scope of Claims.

The invention claimed is:

1. A method of manufacturing a semiconductor package utilizing a support body in which a first layer is stacked on a second layer, the method comprising:
a first step of forming an opening in the first layer to expose the second layer therethrough;
a second step of arranging a semiconductor chip on the second layer through the opening;
a third step of forming a resin portion on the first layer to cover the semiconductor chip;
a fourth step of forming a wiring structure on the resin portion so as to be electrically connected to the semiconductor chip; and
a fifth step of at least partially removing the second layer.

2. The method of manufacturing a semiconductor package according to claim 1,
wherein an electrode terminal is formed on the first layer,
wherein, in the third step, a through hole is formed in the resin portion to expose the electrode terminal therethrough, and
wherein, in the fourth step, the wiring structure is formed to be electrically connected to the electrode terminal through the through hole.

3. The method of manufacturing a semiconductor package according to claim 1,
wherein the fifth step includes removing the first layer and the second layer.

4. The method of manufacturing a semiconductor package according to claim 1,
wherein the fifth step includes partially removing the first layer and the second layer so that parts of the first layer and the second layer remain on a surface of the resin portion, which is opposite to a surface touching the wiring structure, as a frame-like portion, the frame-like portion surrounding the semiconductor chip and the electrode terminal.

5. The method of manufacturing a semiconductor package according to claim 1,
wherein the first layer is made of copper or copper alloy, and
wherein the second layer is made of nickel or nickel alloy.

6. The method of manufacturing a semiconductor package according to claim 1,
wherein the first layer is made of copper or copper alloy, and
wherein the second layer is made of a resin.

7. The method of manufacturing a semiconductor package according to claim 1,
wherein the wiring structure includes an electrode pad.

8. The method of manufacturing a semiconductor package according to claim 1,
wherein the wiring structure includes plural wiring layers and plural insulating layers which are alternately stacked.

9. The method of manufacturing a semiconductor package according to claim 1,
wherein, in the fourth step,
openings are formed in the resin portion to expose an electrode pad of the semiconductor chip and an electrode terminal formed on the first layer, respectively, and
a wiring layer is formed on the resin portion as a part of the wiring structure so as to be connected to the electrode pad and the electrode terminal through the openings, respectively.

10. A semiconductor package comprising:
a semiconductor chip including a circuit forming surface, a side surface and an back surface opposite to the circuit forming surface;
a resin portion including a body part which covers the circuit forming surface of the semiconductor chip and a side wall part which covers the side surface of the semiconductor chip, the resin portion covering the semiconductor chip such that the back surface of the semiconductor chip protrudes from one surface of the body part, the side wall part having a tapered shape; and
a wiring structure formed on the other surface of the body part of the resin portion so as to be electrically connected to the semiconductor chip.

11. The semiconductor package of claim 10, further comprising:
an electrode terminal formed on the one surface of the body part which is electrically connected to the wiring structure.

12. The semiconductor package of claim 11, further comprising:
a frame-like portion formed on the one surface of the body part to surround the semiconductor chip and the electrode terminal.

13. The semiconductor package of claim 10, further comprising:
a first layer formed on the one surface of the body part to touch the side wall part.

14. The semiconductor package of claim 13,
wherein a surface of the first layer, which is opposite to a surface touching the body part, is flush with the back surface of the semiconductor chip, and
wherein there is further provided a second layer formed on the surface of the first layer and the back surface of the semiconductor chip.

15. The semiconductor package of claim 10,
wherein the wiring structure includes an electrode pad.

16. The semiconductor package of claim 10,
wherein the wiring structure includes plural wiring layers and plural insulating layers which are alternately stacked.

17. The semiconductor package of claim 10,
wherein an electrode pad is formed on the circuit forming surface of the semiconductor chip,
wherein an electrode terminal is formed on one surface of the body part,
wherein openings are formed in the resin portion to expose the electrode pad and the electrode terminal, and
wherein the wiring structure includes a wiring layer which is formed on the resin portion so as to be connected to the electrode pad and the electrode terminal through the openings, respectively.

* * * * *